（12） United States Patent
Gibson et al.

(10) Patent No.: US 7,910,392 B2
(45) Date of Patent: Mar. 22, 2011

(54) METHOD AND SYSTEM FOR ASSEMBLING A SOLAR CELL PACKAGE

(75) Inventors: Kevin R. Gibson, Redwood City, CA (US); Ramon Rosal Reglos, San Ramon, CA (US)

(73) Assignee: Solaria Corporation, Fremont, CA (US)

( * ) Notice: Subject to any disclaimer, the term of this patent is extended or adjusted under 35 U.S.C. 154(b) by 211 days.

(21) Appl. No.: 12/060,801

(22) Filed: Apr. 1, 2008

(65) Prior Publication Data

US 2008/0236664 A1 Oct. 2, 2008

Related U.S. Application Data

(60) Provisional application No. 60/909,691, filed on Apr. 2, 2007, provisional application No. 60/909,692, filed on Apr. 2, 2007.

(51) Int. Cl.
*B29C 65/16* (2006.01)
*H01L 31/0203* (2006.01)
*H01L 31/0232* (2006.01)

(52) U.S. Cl. ............ 438/65; 438/66; 136/246; 136/251; 156/272.8; 257/433

(58) Field of Classification Search .......... 136/243–265; 438/57–98, 24, 48, 118; 257/753, 754, 782, 257/433; 156/272.8
See application file for complete search history.

(56) References Cited

U.S. PATENT DOCUMENTS

| | | | |
|---|---|---|---|
| 2,470,618 A | 5/1949 | Holden | |
| 3,330,700 A | 7/1967 | Sequeira et al. | |
| 3,446,676 A | 5/1969 | Goldsmith et al. | |
| 3,575,721 A | 4/1971 | Mann | |
| 3,597,050 A | 8/1971 | Plumat | |
| 3,641,354 A | 2/1972 | De Ment | |

(Continued)

FOREIGN PATENT DOCUMENTS

AU 743826 B2 2/2002

(Continued)

OTHER PUBLICATIONS

"Emissivity Values for Common Materials". http://www.infrared-thermography.com/material-1.htm retrieved on Apr. 2, 2010.*

(Continued)

*Primary Examiner* — Basia Ridley
*Assistant Examiner* — Christina Chern
(74) *Attorney, Agent, or Firm* — Richard T. Ogawa; Ogawa P.C.

(57) ABSTRACT

Method and system for assembling a solar cell package. According to an embodiment, the present invention provides a method for fabricating solar cells for a solar panel. The method includes providing a first substrate member comprising a plurality of photovoltaic strips thereon. The method also includes providing an optical elastomer material overlying a portion of the first substrate member. The method further includes aligning a second substrate member comprising a plurality of optical concentrating elements thereon such that at least one of the optical concentrating elements being operably coupled to at least one of the plurality of photovoltaic strips, the second substrate member comprising an aperture surface region and an exit surface region. In addition, the method includes coupling the first substrate member to the second substrate member to form an interface region along a first peripheral region of the first substrate member and along a second peripheral region of the second substrate member.

25 Claims, 11 Drawing Sheets

U.S. PATENT DOCUMENTS

| | | | |
|---|---|---|---|
| 3,700,714 A | 10/1972 | Hamilton et al. | |
| 3,819,417 A | 6/1974 | Haynos | |
| 3,849,880 A | 11/1974 | Haynos | |
| 3,874,931 A | 4/1975 | Haynos | |
| 3,951,633 A | 4/1976 | Danihel | |
| 3,993,505 A | 11/1976 | Pack | |
| 3,999,283 A | 12/1976 | Dean et al. | |
| 4,029,519 A | 6/1977 | Schertz et al. | |
| 4,056,405 A | 11/1977 | Varadi | |
| 4,091,798 A | 5/1978 | Selcuk | |
| 4,097,308 A | 6/1978 | Klein et al. | |
| 4,106,952 A | 8/1978 | Kravitz | |
| 4,118,249 A | 10/1978 | Graven et al. | |
| 4,122,833 A | 10/1978 | Selcuk | |
| 4,143,234 A | 3/1979 | Johnson et al. | |
| 4,166,917 A | 9/1979 | Dorfeld et al. | |
| 4,170,507 A | 10/1979 | Keeling et al. | |
| 4,174,978 A | 11/1979 | Lidorenko et al. | |
| 4,193,820 A | 3/1980 | Thomas | |
| 4,203,646 A | 5/1980 | Desso | |
| 4,239,555 A | 12/1980 | Scharlack et al. | |
| 4,257,821 A | 3/1981 | Kelly et al. | |
| 4,291,191 A | 9/1981 | Dahlberg | |
| 4,293,192 A | 10/1981 | Bronstein | |
| 4,295,463 A | 10/1981 | Citron | |
| 4,333,447 A | 6/1982 | Lemrow et al. | |
| 4,355,478 A * | 10/1982 | Armstrong | 140/92.1 |
| 4,361,136 A | 11/1982 | Huang | |
| 4,362,903 A | 12/1982 | Eichelberger et al. | |
| 4,404,422 A | 9/1983 | Green et al. | |
| 4,440,153 A | 4/1984 | Melchior | |
| 4,449,514 A | 5/1984 | Selcuk | |
| 4,454,371 A | 6/1984 | Folino | |
| 4,457,297 A | 7/1984 | Sobczak et al. | |
| 4,463,749 A | 8/1984 | Sobczak et al. | |
| 4,495,360 A | 1/1985 | Anthony | |
| 4,511,618 A | 4/1985 | Duchene et al. | |
| 4,562,637 A * | 1/1986 | Kushima et al. | 219/121.64 |
| 4,571,812 A | 2/1986 | Gee | |
| 4,589,191 A | 5/1986 | Green et al. | |
| 4,638,110 A | 1/1987 | Erbert | |
| 4,663,562 A | 5/1987 | Miller et al. | |
| 4,668,314 A | 5/1987 | Endoh et al. | |
| 4,680,074 A | 7/1987 | Schmitz et al. | |
| 4,683,154 A | 7/1987 | Benson et al. | |
| 4,691,994 A | 9/1987 | Tveryanovich | |
| 4,692,557 A | 9/1987 | Samuelson et al. | |
| 4,697,042 A | 9/1987 | Schilling | |
| 4,711,972 A | 12/1987 | O'Neill | |
| 4,830,038 A | 5/1989 | Anderson et al. | |
| 4,848,319 A | 7/1989 | Appeldorn | |
| 4,863,224 A | 9/1989 | Tveryanovich | |
| 4,953,577 A | 9/1990 | Marshall | |
| 4,964,713 A | 10/1990 | Goetzberger | |
| 4,999,059 A | 3/1991 | Bagno | |
| 5,006,179 A | 4/1991 | Gaddy et al. | |
| 5,011,544 A | 4/1991 | Gaddy et al. | |
| 5,043,198 A | 8/1991 | Maruyama et al. | |
| 5,080,725 A | 1/1992 | Green et al. | |
| 5,118,361 A | 6/1992 | Fraas et al. | |
| 5,153,780 A | 10/1992 | Jorgensen et al. | |
| 5,158,618 A | 10/1992 | Rubin et al. | |
| 5,167,724 A | 12/1992 | Chiang | |
| 5,174,275 A | 12/1992 | Holland | |
| 5,180,442 A | 1/1993 | Elias | |
| 5,180,888 A | 1/1993 | Sugiyama et al. | |
| 5,224,978 A | 7/1993 | Hermant et al. | |
| 5,240,510 A | 8/1993 | Goldade et al. | |
| 5,245,985 A | 9/1993 | Holland | |
| 5,261,970 A | 11/1993 | Landis et al. | |
| 5,344,496 A | 9/1994 | Stern et al. | |
| 5,356,488 A | 10/1994 | Hezel | |
| 5,365,920 A | 11/1994 | Lechner | |
| 5,395,070 A | 3/1995 | Wilk | |
| 5,409,520 A | 4/1995 | Mori et al. | |
| 5,436,725 A | 7/1995 | Ledger | |
| 5,449,626 A | 9/1995 | Hezel | |
| 5,460,659 A | 10/1995 | Krut | |
| 5,466,301 A | 11/1995 | Hammerbacher et al. | |
| 5,468,304 A | 11/1995 | Hammerbacher et al. | |
| 5,478,402 A * | 12/1995 | Hanoka | 136/251 |
| 5,498,297 A | 3/1996 | O'Neill et al. | |
| 5,508,205 A | 4/1996 | Dominquez et al. | |
| 5,517,339 A | 5/1996 | Riccobono et al. | |
| 5,529,054 A | 6/1996 | Shoen | |
| 5,542,409 A | 8/1996 | Sampayo | |
| 5,564,411 A | 10/1996 | Gercis | |
| 5,616,186 A | 4/1997 | Fraas et al. | |
| 5,660,644 A | 8/1997 | Clemens | |
| 5,665,607 A | 9/1997 | Kawama et al. | |
| 5,707,459 A | 1/1998 | Itoyama et al. | |
| 5,709,833 A | 1/1998 | Simone | |
| 5,735,966 A | 4/1998 | Luch | |
| 5,782,993 A | 7/1998 | Ponewash | |
| 5,787,878 A | 8/1998 | Ratliff, Jr. | |
| 5,790,304 A | 8/1998 | Sanders et al. | |
| 5,840,147 A | 11/1998 | Grimm | |
| 5,846,444 A | 12/1998 | Edwards et al. | |
| 5,851,309 A | 12/1998 | Kousa | |
| 5,865,905 A | 2/1999 | Clemens | |
| 5,877,874 A | 3/1999 | Rosenberg | |
| 5,882,434 A | 3/1999 | Horne | |
| 5,915,170 A | 6/1999 | Raab et al. | |
| 5,919,316 A | 7/1999 | Bogorad et al. | |
| 5,936,777 A | 8/1999 | Dempewolf | |
| 5,959,787 A | 9/1999 | Fairbanks | |
| 5,964,216 A | 10/1999 | Hoffschmidt et al. | |
| 6,008,449 A | 12/1999 | Cole | |
| 6,020,553 A | 2/2000 | Yogev | |
| 6,034,322 A | 3/2000 | Pollard | |
| 6,049,035 A | 4/2000 | Tsuri et al. | |
| 6,057,505 A | 5/2000 | Ortabasi | |
| 6,074,614 A | 6/2000 | Hafeman et al. | |
| 6,084,175 A | 7/2000 | Perry et al. | |
| 6,091,017 A | 7/2000 | Stern | |
| 6,091,020 A | 7/2000 | Fairbanks et al. | |
| 6,092,392 A | 7/2000 | Verlinden et al. | |
| 6,093,757 A | 7/2000 | Pern | |
| 6,107,564 A | 8/2000 | Aguilera et al. | |
| 6,118,067 A | 9/2000 | Lashley et al. | |
| 6,134,784 A | 10/2000 | Carrie et al. | |
| 6,150,602 A | 11/2000 | Campbell | |
| 6,167,724 B1 | 1/2001 | Pozivil | |
| 6,242,685 B1 | 6/2001 | Mizukami et al. | |
| 6,252,155 B1 | 6/2001 | Ortabasi | |
| 6,264,510 B1 | 7/2001 | Onizuka | |
| 6,274,402 B1 | 8/2001 | Verlinden et al. | |
| 6,274,860 B1 | 8/2001 | Rosenberg | |
| 6,293,803 B1 | 9/2001 | Rust et al. | |
| 6,294,723 B2 | 9/2001 | Uematsu et al. | |
| 6,309,901 B1 | 10/2001 | Tahon et al. | |
| 6,315,575 B1 | 11/2001 | Kajimoto | |
| 6,320,116 B1 | 11/2001 | Hanoka | |
| 6,323,415 B1 | 11/2001 | Uematsu et al. | |
| 6,333,457 B1 | 12/2001 | Mulligan et al. | |
| 6,333,458 B1 | 12/2001 | Forrest et al. | |
| 6,337,283 B1 | 1/2002 | Verlinden et al. | |
| 6,359,209 B1 | 3/2002 | Glenn et al. | |
| 6,365,823 B1 | 4/2002 | Kondo | |
| 6,387,726 B1 | 5/2002 | Verlinden et al. | |
| 6,395,972 B1 | 5/2002 | Tran et al. | |
| 6,423,568 B1 | 7/2002 | Verlinden et al. | |
| 6,429,037 B1 | 8/2002 | Wenham et al. | |
| 6,433,913 B1 | 8/2002 | Bauer et al. | |
| 6,437,236 B2 | 8/2002 | Watanabe et al. | |
| 6,440,769 B2 | 8/2002 | Peumans et al. | |
| 6,441,297 B1 | 8/2002 | Keller | |
| 6,479,744 B1 | 11/2002 | Tsuzuki et al. | |
| 6,528,716 B2 | 3/2003 | Collette et al. | |
| 6,528,718 B2 | 3/2003 | Yoda et al. | |
| 6,609,836 B1 | 8/2003 | Antonelli et al. | |
| 6,612,705 B1 | 9/2003 | Davidson et al. | |
| 6,617,505 B2 | 9/2003 | Shimada | |
| 6,619,282 B1 | 9/2003 | Murtha | |
| 6,620,995 B2 | 9/2003 | Vasylyev et al. | |
| 6,639,733 B2 | 10/2003 | Minano et al. | |
| 6,641,868 B2 | 11/2003 | Abe et al. | |

| | | |
|---|---|---|
| 6,666,207 B1 | 12/2003 | Arkas et al. |
| 6,676,263 B2 | 1/2004 | Winston |
| 6,700,054 B2 | 3/2004 | Cherney et al. |
| 6,700,055 B2 | 3/2004 | Barone |
| 6,758,609 B2 | 7/2004 | Fathi et al. |
| 6,761,598 B2 | 7/2004 | Onizuka et al. |
| 6,804,062 B2 | 10/2004 | Atwater et al. |
| 6,809,250 B2 | 10/2004 | Gerson |
| 6,815,070 B1 | 11/2004 | Burkle et al. |
| 6,822,157 B2 | 11/2004 | Fujioka |
| 6,825,052 B2 | 11/2004 | Eldridge et al. |
| 6,829,908 B2 | 12/2004 | Bowden et al. |
| 6,843,573 B2 | 1/2005 | Rabinowitz et al. |
| 6,849,797 B2 | 2/2005 | Koyanagi et al. |
| 6,903,261 B2 | 6/2005 | Habraken et al. |
| 6,958,868 B1 | 10/2005 | Pender |
| 7,019,207 B2 | 3/2006 | Harneit et al. |
| 7,055,519 B2 | 6/2006 | Litwin |
| 7,071,134 B2 | 7/2006 | Koyama et al. |
| 7,144,598 B2 | 12/2006 | Moravec et al. |
| 7,156,666 B2 | 1/2007 | Mann |
| 7,190,110 B2 | 3/2007 | Tokai et al. |
| 7,250,209 B2 | 7/2007 | Shibahara et al. |
| 7,282,240 B1 | 10/2007 | Jackman et al. |
| 7,309,831 B2 | 12/2007 | Yamada et al. |
| 7,423,083 B2 | 9/2008 | Kawaguchi et al. |
| 7,595,543 B2 | 9/2009 | Weber et al. |
| 2002/0007845 A1 | 1/2002 | Collette et al. |
| 2002/0018308 A1 | 2/2002 | Winston |
| 2002/0075579 A1 | 6/2002 | Vasylyev et al. |
| 2002/0139414 A1 | 10/2002 | Vasylyev et al. |
| 2003/0015233 A1 | 1/2003 | Barone |
| 2003/0016539 A1 | 1/2003 | Minano et al. |
| 2003/0021897 A1 | 1/2003 | Abe et al. |
| 2003/0037569 A1 | 2/2003 | Arbab et al. |
| 2003/0037814 A1 | 2/2003 | Cohen et al. |
| 2003/0074976 A1 | 4/2003 | Ahmad |
| 2003/0081333 A1 | 5/2003 | Winston |
| 2003/0095340 A1 | 5/2003 | Atwater et al. |
| 2003/0121542 A1 | 7/2003 | Harneit et al. |
| 2003/0156337 A1 | 8/2003 | Davidson et al. |
| 2003/0201007 A1 | 10/2003 | Fraas et al. |
| 2003/0228114 A1 | 12/2003 | Fathi et al. |
| 2003/0228417 A1 | 12/2003 | Nishikawa et al. |
| 2004/0004216 A1 | 1/2004 | Eldridge et al. |
| 2004/0016454 A1 | 1/2004 | Murphy et al. |
| 2004/0021964 A1 | 2/2004 | Rabinowitz et al. |
| 2004/0084077 A1 | 5/2004 | Aylaian |
| 2004/0092668 A1 | 5/2004 | Kawaguichi et al. |
| 2004/0097012 A1 | 5/2004 | Weber et al. |
| 2004/0108813 A1 | 6/2004 | Tokai et al. |
| 2004/0123895 A1 | 7/2004 | Kardauskas et al. |
| 2004/0134531 A1 | 7/2004 | Habraken et al. |
| 2004/0194820 A1 | 10/2004 | Barone |
| 2004/0229394 A1 | 11/2004 | Yamada |
| 2004/0243364 A1 | 12/2004 | Wendelin et al. |
| 2004/0246605 A1 | 12/2004 | Stiles et al. |
| 2005/0070059 A1 | 3/2005 | Blakers et al. |
| 2005/0081908 A1 | 4/2005 | Stewart |
| 2005/0081909 A1 | 4/2005 | Paull |
| 2005/0087294 A1 | 4/2005 | Rabinowitz |
| 2005/0133082 A1 | 6/2005 | Konold et al. |
| 2006/0054211 A1 | 3/2006 | Meyers et al. |
| 2006/0099833 A1 | 5/2006 | Mann |
| 2006/0105879 A1 | 5/2006 | Kasuga et al. |
| 2006/0207646 A1 | 9/2006 | Terreau et al. |
| 2006/0235717 A1 | 10/2006 | Sharma et al. |
| 2006/0266406 A1 | 11/2006 | Faust et al. |
| 2006/0272698 A1 | 12/2006 | Durvasula |
| 2006/0283495 A1 | 12/2006 | Gibson |
| 2007/0056026 A1 | 3/2007 | Funcelli |
| 2007/0095386 A1 | 5/2007 | Gibson |
| 2007/0153354 A1 | 7/2007 | Duston et al. |
| 2007/0251568 A1 | 11/2007 | Maeda |
| 2008/0060696 A1 | 3/2008 | Ho et al. |
| 2008/0197376 A1 | 8/2008 | Bert et al. |
| 2008/0236650 A1 | 10/2008 | Gibson et al. |
| 2008/0236655 A1 | 10/2008 | Baldwin et al. |
| 2008/0236664 A1 | 10/2008 | Gibson et al. |
| 2008/0241479 A1 | 10/2008 | Nghiem et al. |
| 2008/0314438 A1 | 12/2008 | Tran et al. |

FOREIGN PATENT DOCUMENTS

| | | |
|---|---|---|
| AU | 220348 A5 | 6/2002 |
| AU | 3902270 A4 | 5/2003 |
| AU | 2349175 AA | 6/2003 |
| CA | 2432300 AA | 6/2002 |
| CA | 2467112 AA | 6/2003 |
| DE | 298 23 351 U1 | 6/1999 |
| EP | 0029721 | 6/1981 |
| EP | 461124 B1 | 5/1995 |
| EP | 784870 | 4/1996 |
| EP | 657948 A3 | 6/1997 |
| EP | 1 030 376 A1 | 8/2000 |
| EP | 1174342 A1 | 1/2002 |
| EP | 1261039 A1 | 11/2002 |
| EP | 1131586 B1 | 3/2003 |
| EP | 1342259 A1 | 9/2003 |
| EP | 1112597 B1 | 3/2004 |
| EP | 1 427 025 A2 | 6/2004 |
| EP | 1461834 A1 | 9/2004 |
| EP | 1 630 875 A2 | 3/2006 |
| EP | 1 732 141 A1 | 12/2006 |
| GB | 1187969 | 4/1970 |
| JP | 61044741 A | 3/1986 |
| JP | 09018031 | 1/1997 |
| JP | 10104547 A2 | 4/1998 |
| WO | WO 9118420 A1 | 11/1991 |
| WO | WO 9406046 A1 | 3/1994 |
| WO | WO 9506330 A1 | 3/1995 |
| WO | WO 9533220 A1 | 12/1995 |
| WO | WO 9623115 A1 | 8/1996 |
| WO | WO 9624954 A1 | 8/1996 |
| WO | WO 9803823 A1 | 1/1998 |
| WO | WO 9832164 A1 | 7/1998 |
| WO | WO 9905462 A1 | 2/1999 |
| WO | WO 0074147 A1 | 12/2000 |
| WO | WO 0079593 A1 | 12/2000 |
| WO | WO 0151962 A2 | 7/2001 |
| WO | WO 0155650 A3 | 8/2001 |
| WO | WO 0190661 A3 | 11/2001 |
| WO | WO 0208058 A1 | 1/2002 |
| WO | WO 0245143 A1 | 6/2002 |
| WO | WO 02075225 A2 | 9/2002 |
| WO | WO 0155650 C2 | 10/2002 |
| WO | WO 02095838 A1 | 11/2002 |
| WO | WO 03019083 A1 | 3/2003 |
| WO | WO 03022578 A1 | 3/2003 |
| WO | WO 03047004 A1 | 6/2003 |
| WO | WO 03049201 A1 | 6/2003 |
| WO | WO 03107078 A2 | 12/2003 |
| WO | WO 2004100252 A1 | 11/2004 |
| WO | WO 2006/015430 A1 | 2/2006 |
| WO | WO 2006/089540 A2 | 8/2006 |
| WO | WO 2006/123194 A1 | 11/2006 |
| WO | WO 2006/128417 A1 | 12/2006 |
| WO | WO 2006/133126 A2 | 12/2006 |
| WO | WO 2007/036199 A2 | 4/2007 |

OTHER PUBLICATIONS

International Search Report and Written Opinion of PCT Application No. PCT/US 08/59167, date of mailing Dec. 8, 2008, 11 pages total.

Andreev et al., "Concentrator PV Modules of "All-Glass" Design With Modified Structure;" Paper 3P-C3-72 presented at WCPEC-3, Osaka Japan; May 11-18, 2003; 4 pages.

ACLAR Fluropolymer Film by SPI Supplies, http://web.archive.org/web/20021022180352/http://www.2spi.com/catalog/photo/acalr-film.shtml, 3 pages, 2000.

Boedeker Plastics, Inc.: Acrylic Polymethyl-MethAcrylate PMMA datasheet, http://www.boedeker.com/acryl.html; May 7,1999; pp. 1-2.

Breeze, A.J., et al., "Improving power efficiencies in polymer—polymer blend photovoltaics", Solar Energy Materials & Solar Cells, 83, 2004, pp. 263-271.

"3M Glass Bubbles", Product Catalogue for 3M Energy and Advance Materials, Feb. 18, 2009, pp. 1-3.

King et al. "Photovoltaic Module Performance and Durability Following Long-Term Field Exposure", Prog. Photovol: Res. and Appl., vol. 8, No. 2, p. 241-256 (May 23, 2000).

Marayuma, T., et al. "Wedge-shaped light concentrator using total internal reflection", Solar Energy Materials & Solar Cells, 57, (1999), pp. 75-83.

Nitto Denko, Web page: http://www.nitto.com/ product/datasheet/037/index.html as updated on Apr. 18, 2005 from Internet Archive, 2 pages.

Pern et al, "Photothermal Stability of an E-Beam Pre-Crosslinked EVA Encapsulant and Its Performance Degradation on a-Si Submodules", NREL/CP-520-31026, Oct. 2001, Lakewood, Colorado, 4 pages.

Petrie, "Additives in Radiation (EB/UV) Cured Adhesive Formulations" www.specialchem4adhesives.com, Oct. 14, 2002, 6 pages.

Photovoltaic/Solar Panel Laminations; MADICO, http://www.madico.com/specialty_pv.asp; Jun. 11, 2007; pp. 1-2.

Solar Electricity Beginner Notes, Sun Wind Solar; Jan. 8, 2004; http://www.sunwindsolar.com/a_lessons/solar_beginner_notes.html; pp. 1-2.

Wells, G.M., et al. "Effects of mirror surface roughness on exposure field uniformity in synchrontron x-ray lithography", American Vacuum Society, J. Vac. Sci. Technol., 1991, pp. 3227-3231.

International Search Report and Written Opinion for PCT Patent Application No. PCT/US2010/024943, mailed Apr. 22, 2010, 9 pages.

International Search Report and Written Opinion for PCT Patent Application No. PCT/US2008/71127, mailed Oct. 22, 2008, 9 pages.

International Search Report and Written Opinion for PCT Patent Application No. PCT/US2008/059170 mailed Aug. 6, 2008, 8 pages.

International Search Report and Written Opinion for PCT Patent Application No. PCT/US2008/075134 mailed Dec. 5, 2008, 9 pages.

International Search Report and Written Opinion for PCT Patent Application No. PCT/US2008/064132 mailed Aug. 15, 2008, 8 pages.

International Search Report and Written Opinion for PCT Patent Application No. PCT/US2006/35793, mailed May 10, 2007, 8 pages.

International Search Report and Written Opinion of PCT Patent Application No. PCT/US2006/29164, mailed Jun. 5, 2008, 16 pages.

International Search Report and Written Opinion for PCT Patent Application No. PCT/US2006/21803, dated Aug. 30, 2007, 21 pages.

Office Action for U.S. Appl. No. 11/445,933 dated Apr. 14, 2010, 7 pages.

Office Action for U.S. Appl. No. 11/445,933 dated Oct. 14, 2009, 8 pages.

Office Action for U.S. Appl. No. 11/445,948 dated April 15, 2010, 27 pages.

Office Action for U.S. Appl. No. 11/445,948 dated May 22, 2009, 18 pages.

Office Action for U.S. Appl. No. 11/354,530 dated Jan. 6, 2010, 7 pages.

Office Action for U.S. Appl. No. 11/493,380 dated Jul. 22, 2009, 22 pages.

Office Action for U.S. Appl. No. 11/493,380 dated Feb. 17, 2009, 24 pages.

Office Action for U.S. Appl. No. 11/493,380 dated May 30, 2008, 25 pages.

Office Action for U.S. Appl. No. 12/136,572 dated Feb. 4, 2010, 15 pages.

Office Action for U.S. Appl. No. 12/136,574 dated Jan. 12, 2010, 15 pages.

Office Action for U.S. Appl. No. 12/136,574 dated Jun. 8, 2009, 10 pages.

Office Action for U.S. Appl. No. 12/136,574 dated Dec. 29, 2008, 9 pages.

Office Action for U.S. Appl. No. 12/136,577 dated Jun. 8, 2009, 12 pages.

Office Action for U.S. Appl. No. 12/136,581 dated Feb. 4, 2010, 13 pages.

Office Action for U.S. Appl. No. 11/0402,490 dated Oct. 30, 2009, 12 pages.

Office Action for U.S. Appl. No. 11/0402,490 dated Mar. 3, 2009, 18 pages.

Office Action for U.S. Appl. No. 12/167,198 dated Dec. 19, 2008, 15 pages.

Office Action for U.S. Appl. No. 11/254,114 dated Feb. 2, 2010, 10 pages.

Office Action for U.S. Appl. No. 11/253,182 dated Feb. 5, 2010, 6 pages.

Office Action for U.S. Appl. No. 11/253,182 dated Jan. 8, 2009, 14 pages.

Office Action for U.S. Appl. No. 11/252,425 dated Oct. 16, 2009, 6 pages.

Office Action for U.S. Appl. No. 11/252,425 dated Mar. 19, 2009, 6 pages.

Office Action for U.S. Appl. No. 11/252,425 dated Jul. 9, 2008, 15 pages.

Office Action for U.S. Appl. No. 11/253,418 dated Sep. 11, 2009, 19 pages.

Office Action for U.S. Appl. No. 11/253,202 dated Aug. 31, 2009, 22 pages.

Office Action for U.S. Appl. No. 11/253,202 dated Feb. 19, 2009, 19 pages.

Office Action for U.S. Appl. No. 11/252,399 dated Dec. 4, 2009, 22 pages.

Office Action for U.S. Appl. No. 11/252,399 dated Jun. 2, 2009, 17 pages.

Office Action for U.S. Appl. No. 11/252,399 dated Aug. 20, 2008, 16 pages.

Office Action for U.S. Appl. No. 11/254,041 dated Jan. 26, 2010, 8 pages.

Office Action for U.S. Appl. No. 11/290,313 dated April 15, 2010, 10 pages.

Office Action for U.S. Appl. No. 11/290,313 dated Sep. 21, 2009, 7 pages.

Office Action dated Mar. 31, 2010 for U.S. Appl. No. 11/753,546, 10 pages.

Office Action for U.S. Appl. No. 12/332,340 dated Apr. 26, 2010, 17 pages.

Office Action for U.S. Appl. No. 11/841,899 of Mar. 11, 2008, 18 pages.

* cited by examiner

METHOD AND SYSTEM FOR ASSEMBLING A SOLAR CELL PACKAGE

CROSS-REFERENCES TO RELATED APPLICATIONS

This application claims priority to U.S. Patent Application No. 60/909,691, filed Apr. 2, 2007 and U.S. Patent Application No. 60/909,692, filed Apr. 2, 2007, both are commonly assigned and herein incorporated by reference for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to solar energy techniques. In particular, the present invention provides a method and resulting device fabricated from a plurality of concentrating elements respectively coupled to a plurality of photovoltaic regions. For example, concentrating elements are coupled to a plurality of photovoltaic regions using one or more coupled structures. More particularly, the present method and structure are directed to a laser sealing technique of a solar cell package apparatus. Merely by way of example, the invention has been applied to solar panels, commonly termed modules, but it would be recognized that the invention has a much broader range of applicability.

As the population of the world increases, industrial expansion has lead to an equally large consumption of energy. Energy often comes from fossil fuels, including coal and oil, hydroelectric plants, nuclear sources, and others. As merely an example, the International Energy Agency projects further increases in oil consumption, with developing nations such as China and India accounting for most of the increase. Almost every element of our daily lives depends, in part, on oil, which is becoming increasingly scarce. As time further progresses, an era of "cheap" and plentiful oil is coming to an end. Accordingly, other and alternative sources of energy have been developed.

Concurrent with oil, we have also relied upon other very useful sources of energy such as hydroelectric, nuclear, and the like to provide our electricity needs. As an example, most of our conventional electricity requirements for home and business use comes from turbines run on coal or other forms of fossil fuel, nuclear power generation plants, and hydroelectric plants, as well as other forms of renewable energy. Often times, home and business use of electrical power has been stable and widespread.

Most importantly, much if not all of the useful energy found on the Earth comes from our sun. Generally all common plant life on the Earth achieves life using photosynthesis processes from sun light. Fossil fuels such as oil were also developed from biological materials derived from energy associated with the sun. For human beings including "sun worshipers," sunlight has been essential. For life on the planet Earth, the sun has been our most important energy source and fuel for modern day solar energy.

Solar energy possesses many characteristics that are very desirable! Solar energy is renewable, clean, abundant, and often widespread. Certain technologies developed often capture solar energy, concentrate it, store it, and convert it into other useful forms of energy.

Solar panels have been developed to convert sunlight into energy. As merely an example, solar thermal panels often convert electromagnetic radiation from the sun into thermal energy for heating homes, running certain industrial processes, or driving high grade turbines to generate electricity. As another example, solar photovoltaic panels convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successful for certain applications, there are still certain limitations. Solar cells are often costly. Depending upon the geographic region, there are often financial subsidies from governmental entities for purchasing solar panels, which often cannot compete with the direct purchase of electricity from public power companies. Additionally, the panels are often composed of silicon bearing wafer materials. Such wafer materials are often costly and difficult to manufacture efficiently on a large scale. Availability of solar panels is also somewhat scarce. That is, solar panels are often difficult to find and purchase from limited sources of photovoltaic silicon bearing materials. These and other limitations are described throughout the present specification, and may be described in more detail below.

From the above, it is seen that techniques for improving solar devices is highly desirable.

BRIEF SUMMARY OF THE INVENTION

The present invention relates generally to solar energy techniques. In particular, the present invention provides a method and resulting device fabricated from a plurality of concentrating elements respectively coupled to a plurality of photovoltaic regions. For example, concentrating elements are coupled to a plurality of photovoltaic regions using one or more coupled structures. More particularly, the present method and structure are directed to a laser sealing technique of a solar cell package apparatus. Merely by way of example, the invention has been applied to solar panels, commonly termed modules, but it would be recognized that the invention has a much broader range of applicability.

In a specific embodiment, the present invention provides a method for fabricating solar cell for a solar panel. The method includes providing a first substrate member comprising a plurality of photovoltaic strips thereon. The method includes providing an optical elastomer material overlying a portion of the first substrate member. In a specific embodiment, the method aligns a second substrate member comprising a plurality of optical concentrating elements thereon such that at least one of the optical concentrating elements is operably coupled to at least one of the plurality of photovoltaic strips. In a specific embodiment, the second substrate member comprises an aperture surface region and an exit surface region. The method couples the first substrate member to the second substrate member to form an interface region along a first peripheral region of the first substrate member and a second peripheral region of the second substrate member. In a specific embodiment, the method includes blocking an inner region of the aperture surface region of the second substrate member while exposing the peripheral region of the aperture surface region of the second substrate member.

According to another embodiment, the present invention provides A method for fabricating a solar cell free and separate from a solar panel. The method includes providing a first substrate member comprising a plurality of photovoltaic strips thereon, the first substrate member having a first peripheral region, the first peripheral region including a first flat region and a first structure region, the first structure region including a protruding structure. The method also includes providing an optical elastomer material overlying a portion of the first substrate member. Furthermore, the method includes providing a second substrate member having a second peripheral region, the second peripheral region including a second flat region and a second structure region, the second structure region including an indent structure. Additionally, the method includes aligning the second substrate member comprising a plurality of optical concentrating elements thereon such that the first flat region of the first substrate mates with the second flat region of the second substrate and the first structure region, the second substrate member comprising an aperture surface region and an exit surface region. The method also includes coupling the first substrate member to the second substrate member to form a sealing region between the first peripheral region of the first substrate member and the second peripheral region of the second substrate member and to engage the first structure region of the first substrate to the second structure region of the second substrate.

According to yet another embodiment, the present invention provides a solar cell package. The package includes a first substrate member comprising a plurality of photovoltaic strips thereon, the first substrate member having a first peripheral region, the first peripheral region including a first flat region and a first structure region, the first structure region comprising an protruding structure. The package also includes an optical elastomer material overlying a portion of the first substrate member. The package also includes a second substrate member having a second peripheral region, the second peripheral region including a second flat region and a second structure region, the second substrate being aligned such that the first flat region of the first substrate mates with the second flat region of the second substrate and the first structure region, the second substrate member comprising an aperture surface region and an exit surface region, the second structure region comprising an indent structure.

In a specific embodiment, the method also irradiates an entirety of the second peripheral region of the second substrate member using electromagnetic radiation to seal the interface region between the second substrate and the first substrate. In a preferred embodiment, the blocking selectively allows for irradiation of the second peripheral region of the second substrate member to seal the interface region. In an alternative embodiment, irradiating an entirety of the second peripheral region of the second substrate member uses a flash or pulses of electromagnetic radiation to seal the interface region between the second substrate and the first substrate, while the inner region of the aperture surface region remains blocked using blocking material.

In an alternative embodiment, the invention provides a system for manufacture of solar cells. In a specific embodiment, the apparatus has a stage member, which can be a mechanical attachment member, vacuum member, or other suitable device. The apparatus has a first substrate member comprising a plurality of photovoltaic regions thereon provided on the stage member, an optical elastomer material overlying a portion of the first substrate member, an aligned second substrate member comprising a plurality of optical concentrating elements thereon such that at least one of the optical concentrating elements being operably coupled to at least one of the plurality of photovoltaic strips, the second substrate member comprising an aperture surface region and an exit surface region, and an interface region provided along a first peripheral region of the first substrate member and a second peripheral region of the second substrate member. In a preferred embodiment, a blocking member is provided within an inner region of the aperture surface region of the second substrate member while exposing the peripheral region of the aperture surface region of the second substrate member. The apparatus also has an irradiation source coupled to the stage member. In a specific embodiment, the irradiation source is adapted to irradiate an entirety of the second peripheral region of the second substrate member using a flash or pulses of electromagnetic radiation to seal the interface region between the second substrate and the first substrate, while the inner region of the aperture surface region remains blocked using blocking material.

Many benefits are achieved by way of the present invention over conventional techniques. For example, the present technique provides an easy to use process that relies upon conventional technology such as silicon materials, although other materials can also be used. Additionally, the method provides a process that is compatible with conventional process technology without substantial modifications to conventional equipment and processes. Preferably, the invention provides for an improved solar cell, which is less costly and easy to handle. Such solar cell uses a plurality of photovoltaic regions, which are sealed within one or more substrate structures according to a preferred embodiment. In a preferred embodiment, the invention provides a method and completed solar cell structure using a plurality of photovoltaic strips free and clear from a module or panel assembly, which are provided during a later assembly process. Also in a preferred embodiment, one or more of the solar cells have less silicon per area (e.g., 80% or less, 50% or less) than conventional solar cells. In preferred embodiments, the present method and cell structures are also light weight and not detrimental to building structures and the like. That is, the weight is about the same or slightly more than conventional solar cells at a module level according to a specific embodiment. In a preferred embodiment, the present solar cell using the plurality of photovoltaic strips can be used as a "drop in" replacement of conventional solar cell structures. As a drop in replacement, the present solar cell can be used with conventional solar cell technologies for efficient implementation according to a preferred embodiment. In a preferred embodiment, the present method and system provide a way of sealing an interface region between two substrate members using an electromagnetic radiation source, which is relatively easy to use and cost effective. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention relates generally to solar energy techniques. In particular, the present invention provides a method and resulting device fabricated from a plurality of concentrating elements respectively coupled to a plurality of photovoltaic regions. For example, concentrating elements are coupled to a plurality of photovoltaic regions using one or more coupled structures. More particularly, the present method and structure are directed to a laser sealing technique of a solar cell package apparatus. Merely by way of example, the invention has been applied to solar panels, commonly termed modules, but it would be recognized that the invention has a much broader range of applicability.

Figure 1:
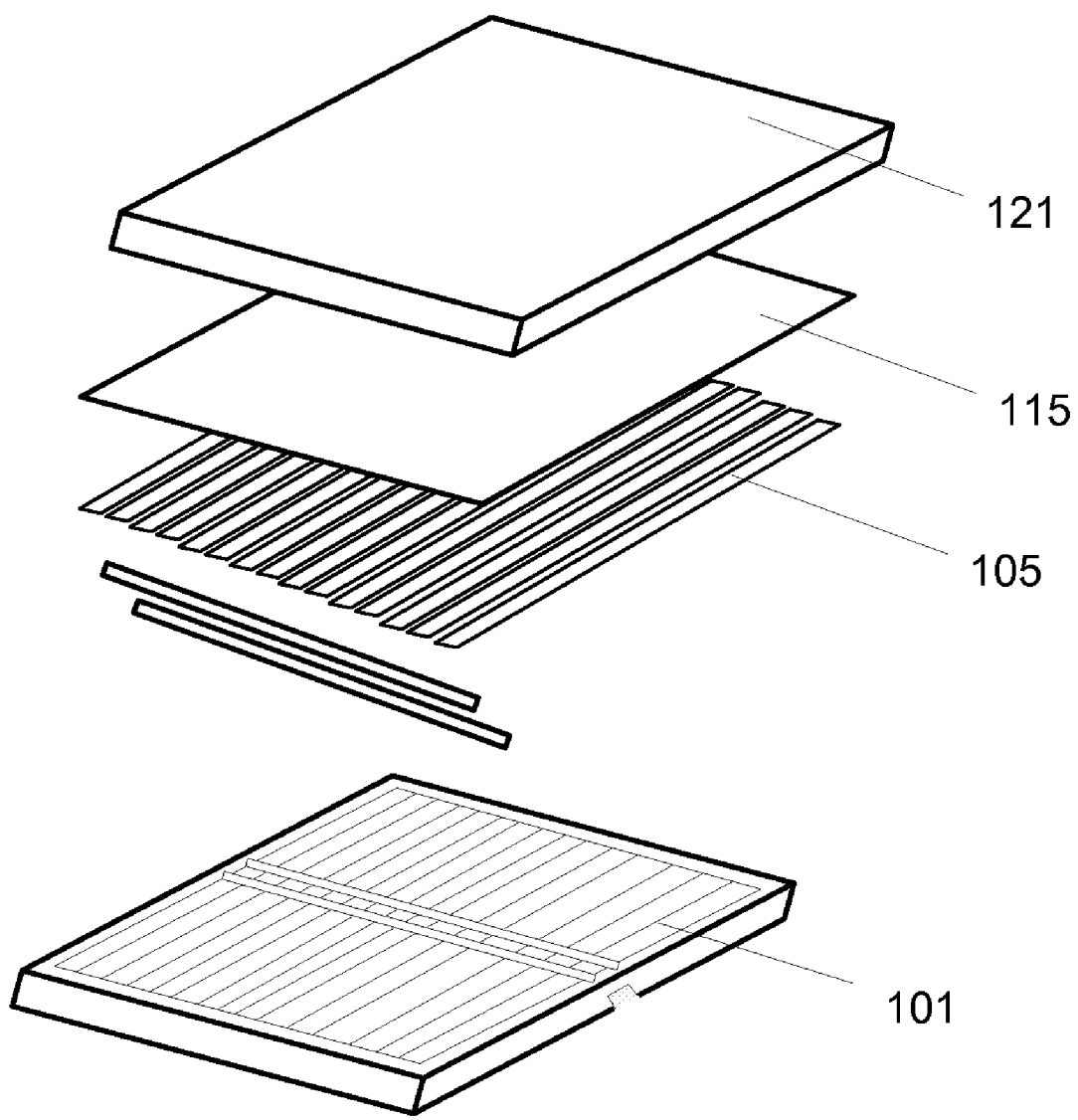
FIG. 1 is a simplified diagram of a solar cell according to an embodiment of the present invention.

FIG. 1 is a simplified diagram of a solar cell according to an embodiment of the present invention. This diagram is merely an example, which should not unduly limit the scope of the claims herein. One of ordinary skill in the art would recognize other variations, modifications, and alternatives. As shown is an expanded view of the present solar cell device structure, which includes various elements. The device has a back cover member 101, which includes a surface area and a back area. The back cover member also has a plurality of sites, which are spatially disposed, for electrical members, such as bus bars, and a plurality of photovoltaic regions. Alternatively, the back cover can be free from any patterns and is merely provided for support and packaging. Of course, there can be other variations, modifications, and alternatives.

In a preferred embodiment, the device has a plurality of photovoltaic strips 105, each of which is disposed overlying the surface area of the back cover member. In a preferred embodiment, the plurality of photovoltaic strips corresponds to a cumulative area occupying a total photovoltaic spatial region, which is active and converts sunlight into electrical energy.

An encapsulating material 115 is overlying a portion of the back cover member. That is, an encapsulating material forms overlying the plurality of strips, and exposed regions of the back cover, and electrical members. In a preferred embodiment, the encapsulating material can be a single layer, multiple layers, or portions of layers, depending upon the application. In alternative embodiments, as noted, the encapsulating material can be provided overlying a portion of the photovoltaic strips or a surface region of the front cover member, which would be coupled to the plurality of photovoltaic strips. Of course, there can be other variations, modifications, and alternatives.

In a specific embodiment, a front cover member 121 is coupled to the encapsulating material. That is, the front cover member is formed overlying the encapsulant to form a multilayered structure including at least the back cover, bus bars, plurality of photovoltaic strips, encapsulant, and front cover. In a preferred embodiment, the front cover includes one or more concentrating elements, which concentrate (e.g., intensify per unit area) sunlight onto the plurality of photovoltaic strips. That is, each of the concentrating elements can be associated respectively with each of or at least one of the photovoltaic strips.

Upon assembly of the back cover, bus bars, photovoltaic strips, encapsulant, and front cover, an interface region is provided along at least a peripheral region of the back cover member and the front cover member. The interface region may also be provided surrounding each of the strips or certain groups of the strips depending upon the embodiment. The device has a sealed region and is formed on at least the interface region to form an individual solar cell from the back cover member and the front cover member. The sealed region maintains the active regions, including photovoltaic strips, in a controlled environment free from external effects, such as weather, mechanical handling, environmental conditions, and other influences that may degrade the quality of the solar cell. Additionally, the sealed region and/or sealed member (e.g., two substrates) protect certain optical characteristics associated with the solar cell and also protects and maintains any of the electrical conductive members, such as bus bars, interconnects, and the like. Of course, there can be other benefits achieved using the sealed member structure according to other embodiments.

In a preferred embodiment, the total photovoltaic spatial region occupies a smaller spatial region than the surface area of the back cover. That is, the total photovoltaic spatial region uses less silicon than conventional solar cells for a given solar cell size. In a preferred embodiment, the total photovoltaic spatial region occupies about 80% and less of the surface area of the back cover for the individual solar cell. Depending upon the embodiment, the photovoltaic spatial region may also occupy about 70% and less or 60% and less or preferably 50% and less of the surface area of the back cover or given area of a solar cell. Of course, there can be other percentages that have not been expressly recited according to other embodiments. Here, the terms "back cover member" and "front cover member" are provided for illustrative purposes, and not intended to limit the scope of the claims to a particular configuration relative to a spatial orientation according to a specific embodiment. Further details of each of the various elements in the solar cell can be found throughout the present specification and more particularly below.

In a specific embodiment, the present invention provides a packaged solar cell assembly being capable of stand-alone operation to generate power using the packaged solar cell assembly and/or with other solar cell assemblies. The packaged solar cell assembly includes rigid front cover member having a front cover surface area and a plurality of concentrating elements thereon. Depending upon applications, the rigid front cover member consists of a variety of materials. For example, the rigid front cover is made of polymer material. As another example, the rigid front cover is made of transparent polymer material having a reflective index of about 1.4 or 1.42 or greater. According to an example, the rigid front cover has a Young's Modulus of a suitable range. Each of the concentrating elements has a length extending from a first portion of the front cover surface area to a second portion of the front cover surface area. Each of the concentrating elements has a width provided between the first portion and the second portion. Each of the concentrating elements having a first edge region coupled to a first side of the width and a second edge region provided on a second side of the width. The first edge region and the second edge region extend from the first portion of the front cover surface area to a second portion of the front cover surface area. The plurality of concentrating elements is configured in a parallel manner extending from the first portion to the second portion.

It is to be appreciated that embodiment can have many variations. For example, the embodiment may further includes a first electrode member that is coupled to a first region of each of the plurality of photovoltaic strips and a second electrode member coupled to a second region of each of the plurality of photovoltaic strips.

As another example, the solar cell assembly additionally includes a first electrode member coupled to a first region of each of the plurality of photovoltaic strips and a second electrode member coupled to a second region of each of the plurality of photovoltaic strips. The first electrode includes a first protruding portion extending from a first portion of the sandwiched assembly and the second electrode comprising a second protruding portion extending from a second portion of the sandwiched assembly.

In yet another specific embodiment, the present invention provides a solar cell apparatus. The solar cell apparatus includes a backside substrate member comprising a backside surface region and an inner surface region. Depending upon application, the backside substrate member can be made from various materials. For example, the backside member is characterized by a polymer material.

In yet another embodiment, the present invention provides a solar cell apparatus that includes a backside substrate member. The backside substrate member includes a backside surface region and an inner surface region. The backside substrate member is characterized by a width. For example, the backside substrate member is characterized by a length of about eight inches and less. As an example, the backside substrate member is characterized by a width of about 8 inches and less and a length of more than 8 inches. Of course, there can be other variations, modifications, and alternatives. Further details of the solar cell assembly can be found in U.S. patent application Ser. No. 11/445,993, commonly assigned, and hereby incorporated by reference herein.

Figure 2:
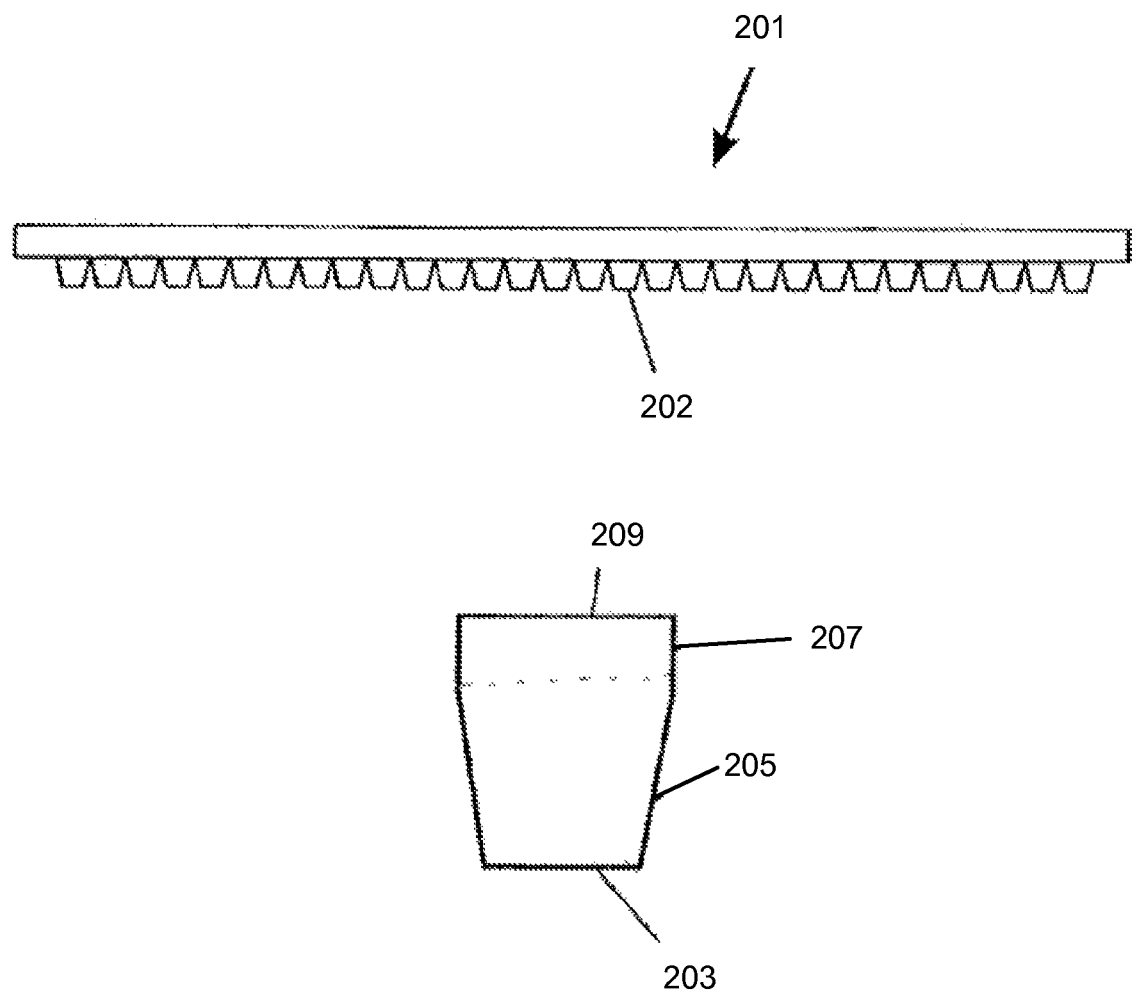
FIG. 2 is a simplified diagram of solar cell concentrating elements according to an embodiment of the present invention.

FIG. 2 is a simplified diagram of solar cell concentrating elements 201 according to an embodiment of the present invention. This diagram is merely an example, which should not unduly limit the scope of the claims herein. One of ordinary skill in the art would recognize other variations, modifications, and alternatives. As shown, each of the concentrating elements for the strip configuration includes a trapezoidal shaped member 205. Each of the trapezoidal shaped members has a bottom surface 203 coupled to a pyramidal shaped region coupled to an upper region 207. The upper region is defined by surface 209, which is co-extensive of the front cover. Each of the members is spatially disposed and in parallel to each other according to a specific embodiment. Here, the term "trapezoidal" or "pyramidal" may include embodiments with straight or curved or a combination of straight and curved walls according to embodiments of the present invention. Depending upon the embodiment, the concentrating elements may be on the front cover, integrated into the front cover, and/or be coupled to the front cover according to embodiments of the present invention. Further details of the front cover with concentrating elements are provided more particularly below.

In a specific embodiment, a solar cell apparatus includes a shaped concentrator device operably coupled to each of the plurality of photovoltaic strips. The shaped concentrator device has a first side and a second side. In addition, the solar cell apparatus includes an aperture region provided on the first side of the shaped concentrator device. As merely an example, the concentrator device includes a first side region and a second side region. Depending upon application, the first side region is characterized by a roughness of about 100 nanometers or 120 nanometers RMS and less, and the second side region is characterized by a roughness of about 100 nanometers or 120 nanometers RMS and less. For example, the roughness is characterized by a dimension value of about 10% of a light wavelength derived from the aperture regions. Depending upon applications, the backside member can have a pyramid-type shape.

As an example, the solar cell apparatus includes an exit region provided on the second side of the shaped concentrator device. In addition, the solar cell apparatus includes a geometric concentration characteristic provided by a ratio of the aperture region to the exit region. The ratio can be characterized by a range from about 1.8 to about 4.5. The solar cell apparatus also includes a polymer material characterizing the shaped concentrator device. The solar cell apparatus additionally includes a refractive index of about 1.45 and greater characterizing the polymer material of the shaped concentrator device. Additionally, the solar cell apparatus includes a coupling material formed overlying each of the plurality of photovoltaic strips and coupling each of the plurality of photovoltaic regions to each of the concentrator devices. For example, the coupling material is characterized by a suitable Young's Modulus.

As merely an example, the solar cell apparatus includes a refractive index of about 1.45 and greater characterizing the coupling material coupling each of the plurality of photovoltaic regions to each of the concentrator device. Depending upon application, the polymer material is characterized by a thermal expansion constant that is suitable to withstand changes due to thermal expansion of elements of the solar cell apparatus.

For certain applications, the plurality of concentrating elements has a light entrance area (A1) and a light exit area (A2) such that A2/A1 is 0.8 and less. As merely an example, the plurality of concentrating elements has a light entrance area (A1) and a light exit area (A2) such that A2/A1 is 0.8 and less, and the plurality of photovoltaic strips are coupled against the light exit area. In a preferred embodiment, the ratio of A2/A1 is about 0.5 and less. For example, each of the concentrating elements has a height of 7 mm or less. In a specific embodiment, the sealed sandwiched assembly has a width ranging from about 100 millimeters to about 210 millimeters and a length ranging from about 100 millimeters to about 210 millimeters. In a specific embodiment, the sealed sandwiched assembly can even have a length of about 300 millimeters and greater. As another example, each of the concentrating elements has a pair of sides. In a specific embodiment, each of the sides has a surface finish of 100 nanometers or less or 120 nanometers and less RMS. Of course, there can be other variations, modifications, and alternatives.

Figure 2A:
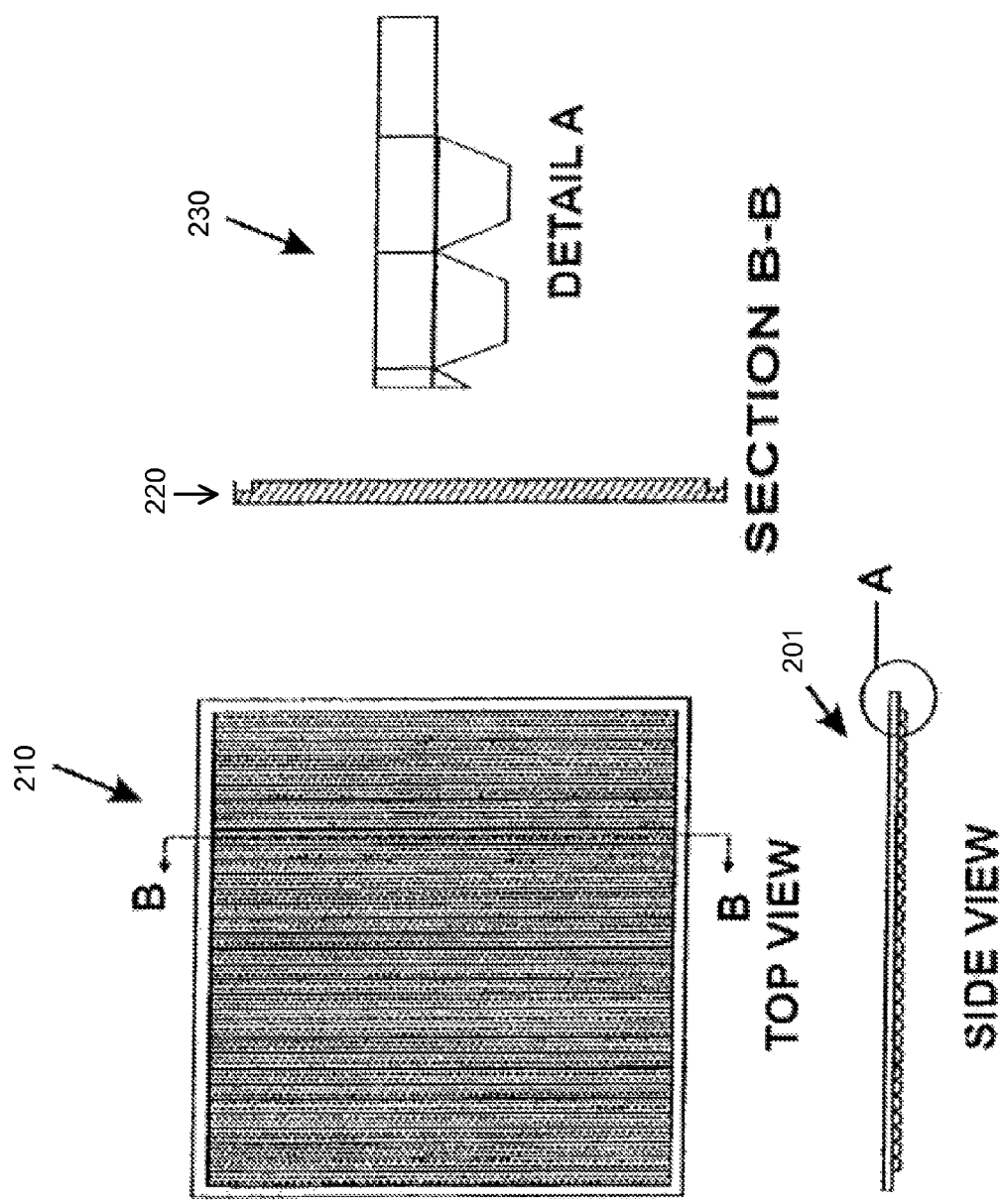
FIG. 2A is a simplified side-view diagram of solar cell concentrating elements according to an embodiment of the present invention.

Referring now to FIG. 2A, the front cover has been illustrated using a side view 201, which is similar to FIG. 2. The front cover also has a top-view illustration 210. A section view 220 from "B-B" has also been illustrated. A detailed view "A" of at least two of the concentrating elements 230 is also shown. Depending upon the embodiment, there can be other variations, modifications, and alternatives.

Depending upon the embodiment, the concentrating elements are made of a suitable material. The concentrating elements can be made of a polymer, glass, or other optically transparent materials, including any combination of these, and the like. The suitable material is preferably environmentally stable and can withstand environmental temperatures, weather, and other "outdoor" conditions. The concentrating elements can also include portions that are coated with an anti-reflective coating for improved efficiency. Coatings can also be used for improving a durability of the concentrating elements. Of course, there can be other variations, modifications, and alternatives.

In a specific embodiment, the solar cell apparatus includes a first reflective side provided between a first portion of the aperture region and a first portion of the exit region. As merely an example, the first reflective side includes a first polished surface of a portion of the polymer material. For certain applications, the first reflective side is characterized by a surface roughness of about 120 nanometers RMS and less.

Moreover, the solar cell apparatus includes a second reflective side provided between a second portion of the aperture region and a second portion of the exit region. For example, the second reflective side comprises a second polished surface of a portion of the polymer material. For certain applications, the second reflective side is characterized by a surface roughness of about 120 nanometers and less. As an example, the first reflective side and the second reflective side provide for total internal reflection of one or more photons provided from the aperture region.

In addition, the solar cell apparatus includes a geometric concentration characteristic provided by a ratio of the aperture region to the exit region. The ratio is characterized by a range from about 1.8 to about 4.5. Additionally, the solar cell apparatus includes a polymer material characterizing the shaped concentrator device, which includes the aperture region, exit region, first reflective side, and second reflective side. As an example, the polymer material is capable of being free from damaged caused by ultraviolet radiation.

Furthermore, the solar cell apparatus has a refractive index of about 1.45 and greater characterizing the polymer material of the shaped concentrator device. Moreover, the solar cell apparatus includes a coupling material formed overlying each of the plurality of photovoltaic strips and coupling each of the plurality of photovoltaic regions to each of the concentrator devices. The solar cell apparatus additionally includes one or more pocket regions facing each of the first reflective side and the second reflective side. The one or more pocket regions can be characterized by a refractive index of about 1 to cause one or more photons from the aperture region to be reflected toward the exit region. To maintain good efficiency of the subject concentrator devices, each of the concentrating elements is separated by a region having a notch structure of a predetermined size and shape according to a specific embodiment. Of course there can be other variations, modifications, and alternatives. Further details of the notch structures can be found throughout the present specification and more particularly below.

Figure 3:
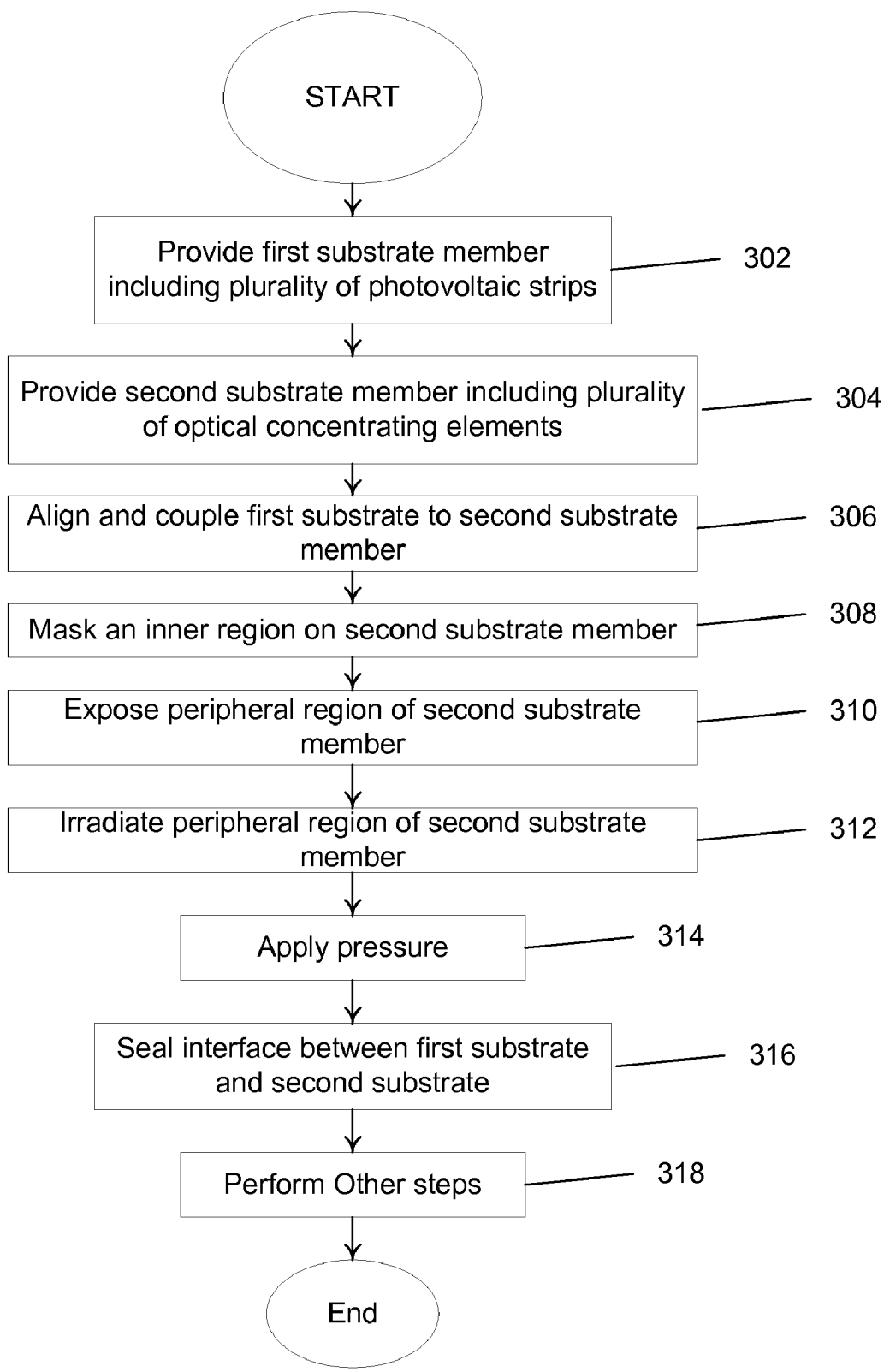
FIGS. 3, 3A, and 3B are simplified flow diagrams illustrating a method of assembling a solar cell apparatus according to an embodiment of the present invention.

FIG. 3 is a simplified flow diagram illustrating a method of assembling a solar cell apparatus according to an embodiment of the present invention. This diagram is merely an example, which should not unduly limit the scope of the claims herein. One of ordinary skill in the art would recognize other variations, modifications, and alternatives. As shown, the method provides a first substrate member (Step 302). The first substrate member includes a plurality of photovoltaic strips thereon. The method provides a second substrate member (Step 304) which includes a plurality of optical concentrating elements. The first substrate member is aligned and couple to the second substrate member (Step 306). In a specific embodiment, an inner region of the second substrate member (Step 308) is blocked from irradiation while a peripheral region remained exposed (Step 310). A pressure is applied (Step 314). The method includes irradiating the exposed peripheral region of the second substrate member (Step 312) and forming a melting region in an interface region between the first substrate member and the second substrate member. The melting region is used to seal peripheral interface between first substrate and second substrate (Step 316). The method continues with other steps (Step 318) to complete the solar cell panel.

The above sequence of steps provide a method for assembling a solar cell panel according to an embodiment of the present invention. Alternatively, one or more of the steps may be performed, one or more steps may be eliminated, or one or more steps may be performed in a different sequence depending on the embodiment. One skilled in the art would recognize many other variations, modifications, and alternatives.

Figure 3A:
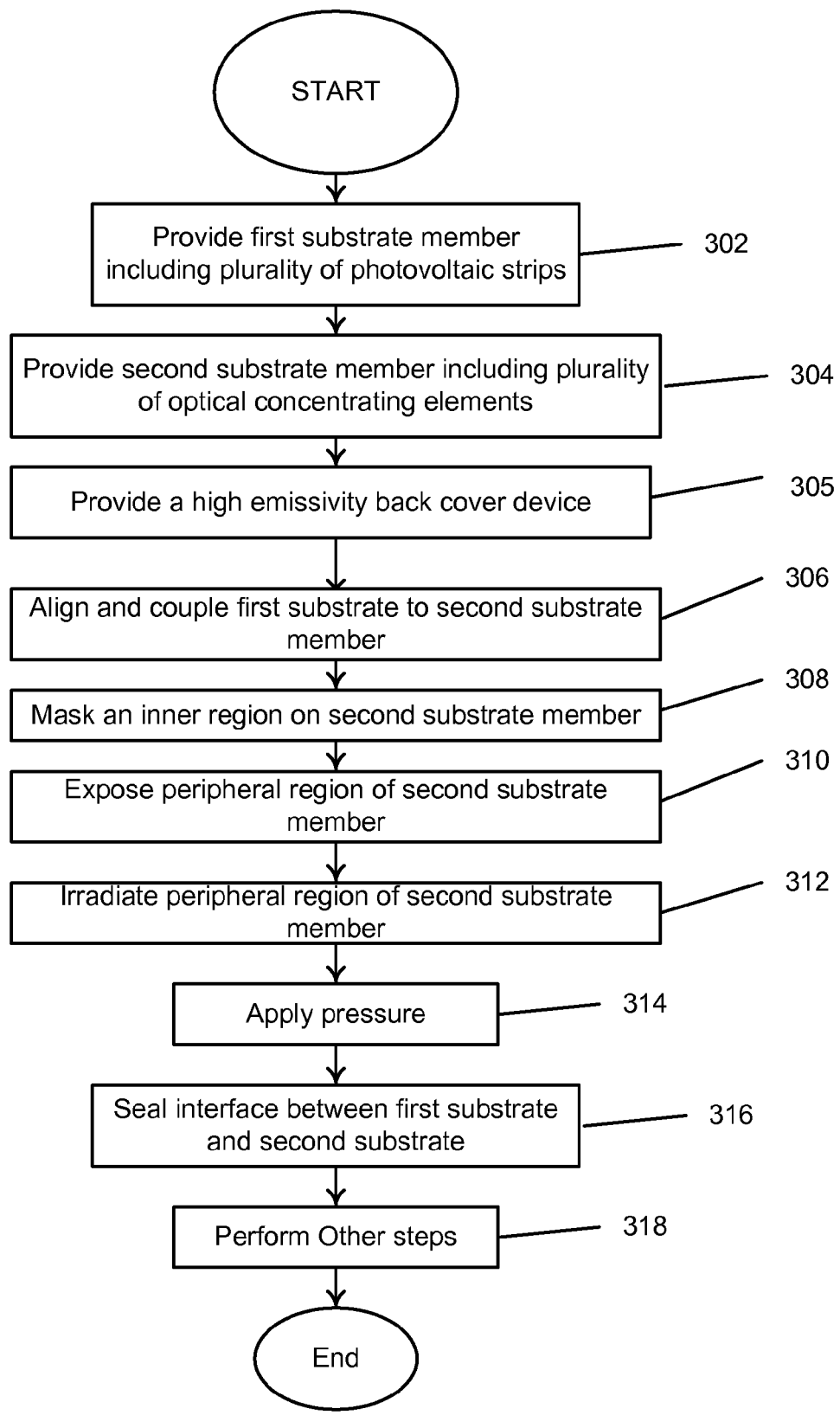

FIG. 3A is a simplified flow diagram illustrating a method of assembling a solar cell apparatus according to an embodiment of the present invention. This diagram is merely an example, which should not unduly limit the scope of the claims herein. One of ordinary skill in the art would recognize other variations, modifications, and alternatives. As shown, the method provides a first substrate member (Step 302). The first substrate member includes a plurality of photovoltaic strips thereon. The method provides a second substrate member (Step 304) which includes a plurality of optical concentrating elements. The method also includes providing a high emissivity back cover device (Step 305). The first substrate member is aligned and couple to the second substrate member (Step 306). In a specific embodiment, an inner region of the second substrate member (Step 308) is blocked from irradiation while a peripheral region remained exposed (Step 310). A pressure is applied (Step 314). The method includes irradiating the exposed peripheral region of the second substrate member (Step 312) and forming a melting region in an interface region between the first substrate member and the second substrate member. As an example, laser is used for providing irradiation. The melting region is used to seal peripheral interface between first substrate and second substrate (Step 316). The method continues with other steps (Step 318) to complete the solar cell panel.

The above sequence of steps provide a method for assembling a solar cell panel according to an embodiment of the present invention. Alternatively, one or more of the steps may be performed, one or more steps may be eliminated, or one or more steps may be performed in a different sequence depending on the embodiment. One skilled in the art would recognize many other variations, modifications, and alternatives.

Figure 3B:
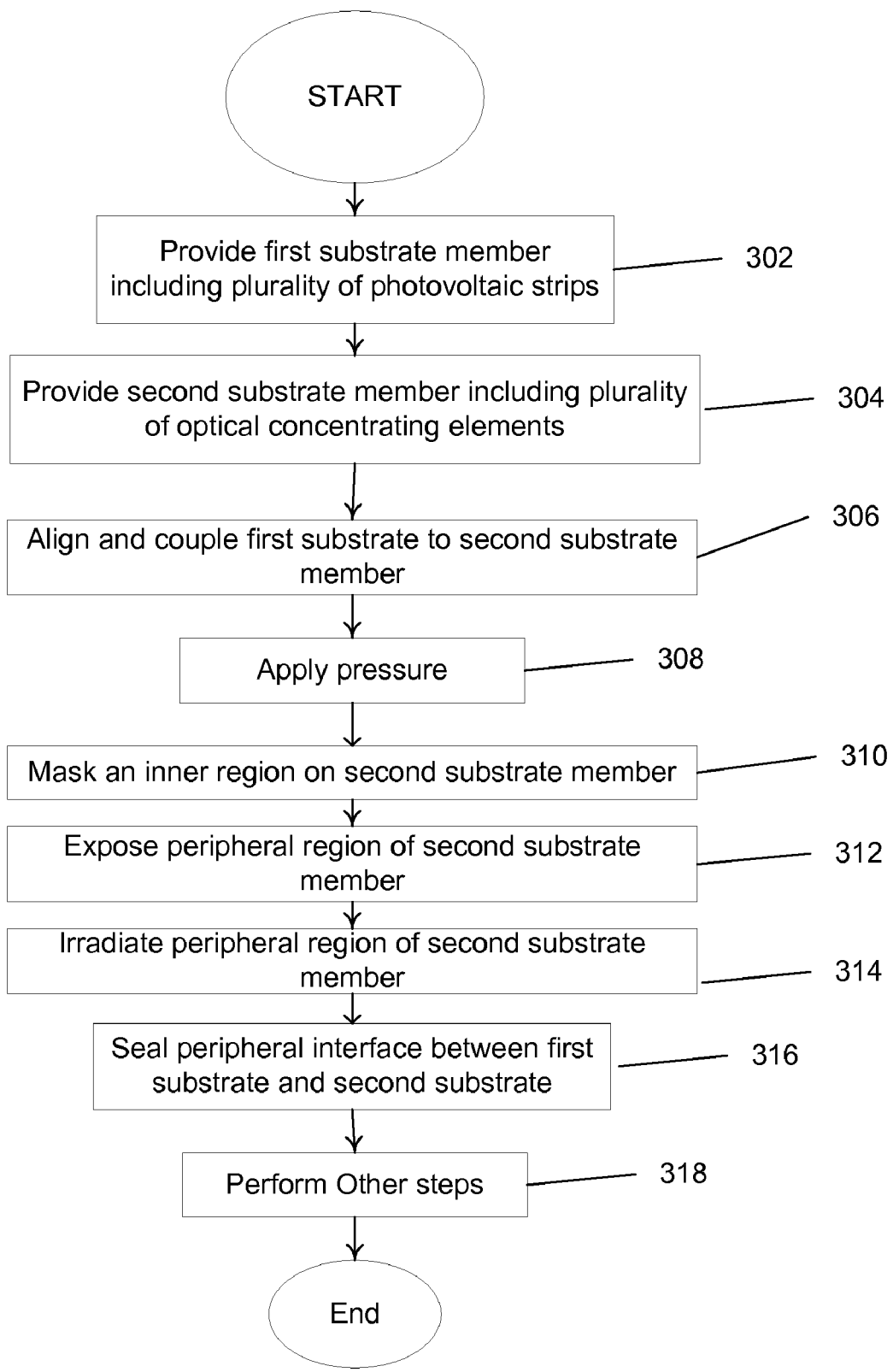

FIG. 3B is a simplified flow diagram illustrating a method of assembling a solar cell apparatus according to an embodiment of the present invention. This diagram is merely an example, which should not unduly limit the scope of the claims herein. One of ordinary skill in the art would recognize other variations, modifications, and alternatives. As shown, the method provides a first substrate member (Step 302). The first substrate member includes a plurality of photovoltaic strips thereon. The method provides a second substrate member (Step 304) which includes a plurality of optical concentrating elements. The method also includes providing a high emissivity back cover device (Step 305). The first substrate member is aligned and couple to the second substrate member (Step 306). A pressure is applied (Step 308). In a specific embodiment, an inner region of the second substrate member (Step 310) is blocked from irradiation while a peripheral region remained exposed (Step 312). The method includes irradiating the exposed peripheral region of the second substrate member (Step 314) and forming a melting region in an interface region between the first substrate member and the second substrate member. The melting region is used to seal peripheral interface between first substrate and second substrate (Step 316). The method continues with other steps (Step 318) to complete the solar cell panel.

The above sequence of steps provide a method for assembling a solar cell panel according to an embodiment of the present invention. Alternatively, one or more of the steps may be performed, one or more steps may be eliminated, or one or more steps may be performed in a different sequence depending on the embodiment. One skilled in the art would recognize many other variations, modifications, and alternatives.

Figure 4:
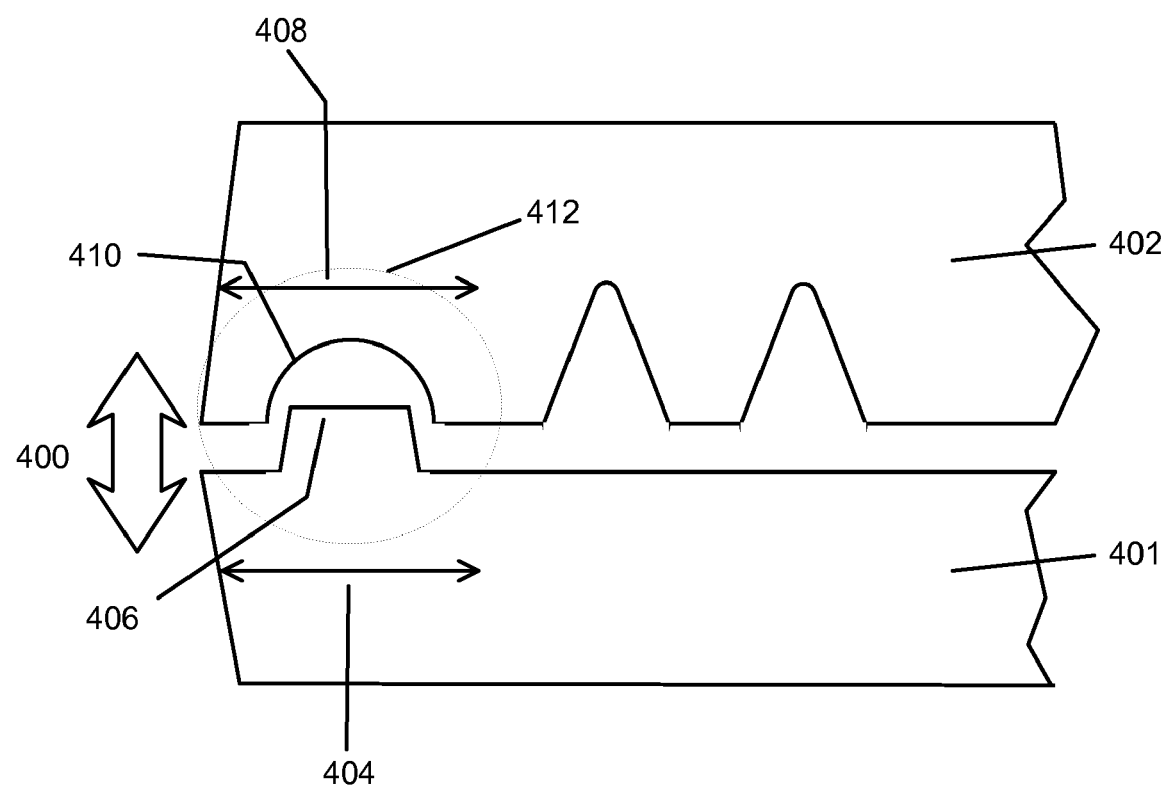
FIG. 4 is a simplified diagram of coupling a back cover member to a concentrator member according to an embodiment of the present invention.

FIG. 4 is a simplified diagram of coupling 400 a back cover member 401 to a concentrator member 402 according to an embodiment of the present invention. This diagram is merely an example, which should not unduly limit the scope of the claims herein. One of ordinary skill in the art would recognize other variations, modifications, and alternatives. As shown in FIG. 4, the back cover member 401 includes, a first peripheral region 404, which has a protruding structure 406 and a first flat region in a portion of the first peripheral region. Also shown in FIG. 4, the concentrator member includes a second peripheral region 408, which has an indent structure 410 and a second flat region in a portion of the second peripheral region. In a specific embodiment, the protruding structure and the indent structure provides a tongue and groove mechanism to couple the back cover member and the concentrator member. Additionally, the back cover member and the concentrator member may be aligned using the tongue and groove mechanism in a specific embodiment, the protruding structure 406 of the back cover member is aligned to a second peripheral region 408 of the concentrator member such that each of the plurality of photovoltaic strips is coupled to a concentrator element in the concentrator member. As shown in FIG. 4, the coupled substrate member includes an interface region 412 formed from the first peripheral region and the second peripheral region. In a specific embodiment, the protruding structure 410 has a semi-circular cross section. For example, the protruding structure 410 has a diameter of about $10/1000$ of an inch or less and runs along the second peripheral region of the concentrator member. Alternatively, the protruding structure can be any shape, for example, the cross section can be rectangular, or other polygon shapes. The indent structure can be shaped accordingly to mate with the protruding structure. Of course there can be other variations, modifications, and alternatives.

Optionally, before coupling, the interface region may be subjected to a cleaning process to remove any material that may affect sealing of the substrate members. The cleaning process can include using a suitable solvents or a combination of solvents followed by drying. Alternatively the cleaning process may include a plasma cleaning, or a blasting process to remove undesirable material. Of course there can be other variations, modifications, and alternatives.

In a specific embodiment, after aligning the concentrator member to the back cover member, a force is provided to mechanically couple the aligned concentrator member to the back cover member. The force may be provided by a plate, fluid pressure, a clamp or any other suitable techniques. Further details of the applied force can be found through the present specification and particularly below. Of course there can be other variations, modifications, and alternatives.

Figure 5:
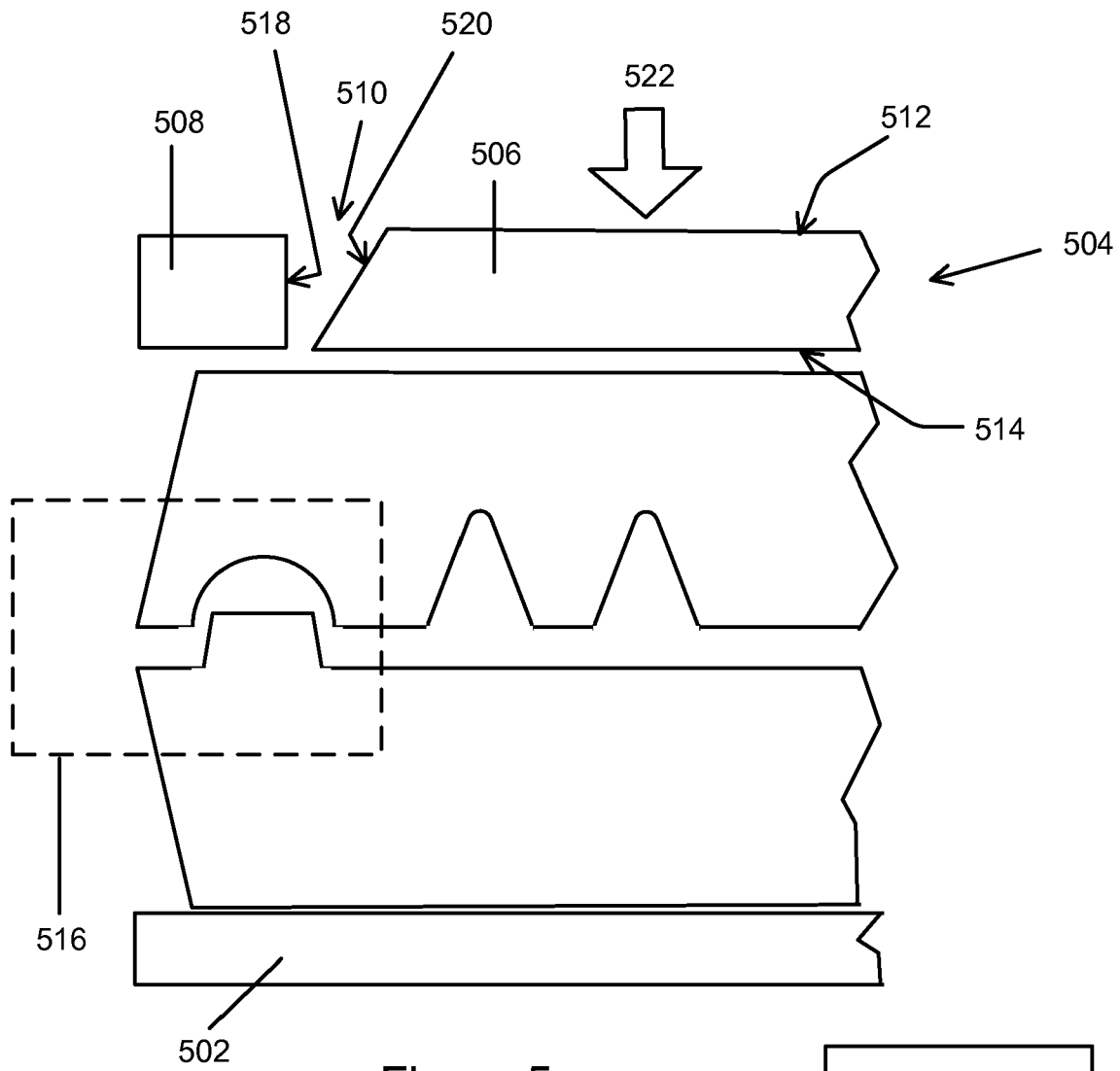
FIGS. 5 and 5A are a simplified diagrams of irradiating peripheral regions of the concentrator member and back cover member to seal them together according to an embodiment of the present invention.
Figure 5A:
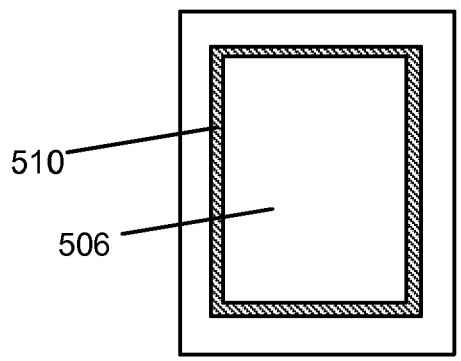
Figure 6:
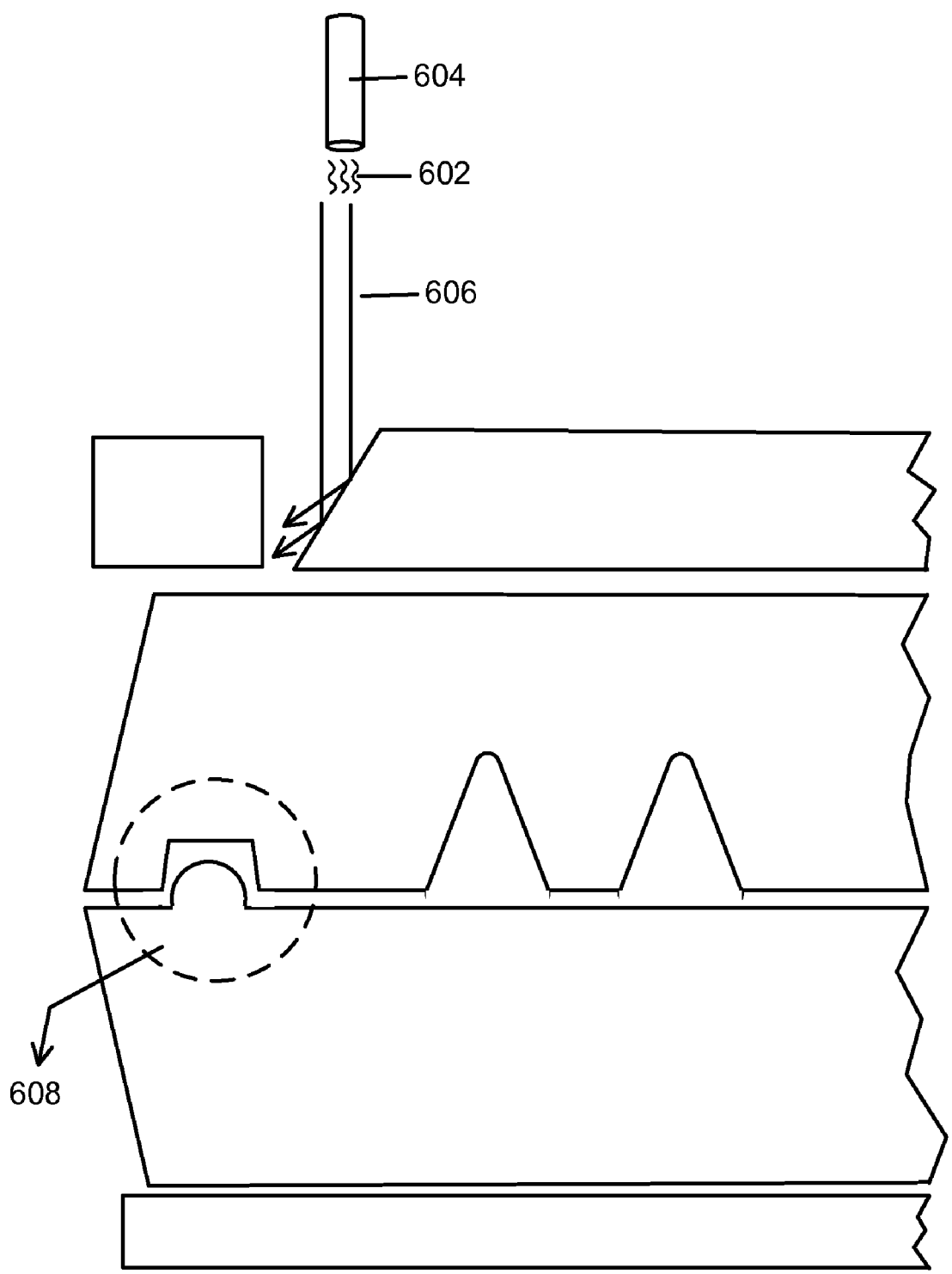
FIG. 6 is a simplified side-view diagram of a concentrator member and a back cover according to an embodiment of the present invention.
Figure 7:
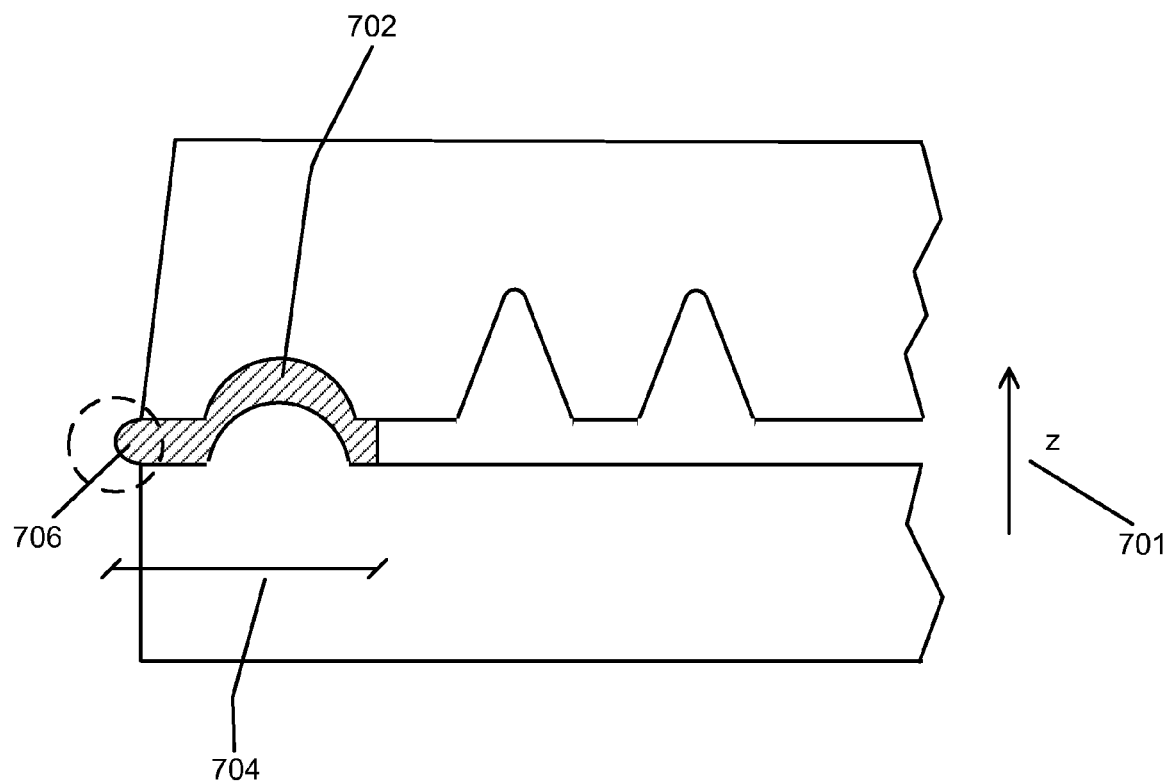
FIG. 7 is a more detailed diagram of a back cover device and a concentrator device according to an embodiment of the present invention.

FIG. 5-7 are simplified diagrams of joining the concentrator member and back cover member and to seal them together using an electromagnetic radiation according to an embodiment of the present invention. These diagrams are merely examples, which should not unduly limit the scope of the claims herein. One of ordinary skill in the art would recognize other variations, modifications, and alternatives. As shown in FIG. 5, a stage member including a waveguide device 504 is provided. The waveguide device includes an inner waveguide 506, an outer waveguide 508, and an opening region 510. The waveguide device also includes an upper surface region 512 and a back surface region 514. In a specific embodiment, the electromagnetic radiation is allowed to pass through the opening region of the waveguide device and blocked by the inner waveguide region and the outer waveguide region. In a specific embodiment, the opening region includes a straight face region 518 and an oblique face region 520. In a specific embodiment, the straight face region may be a flat surface. The straight face region may also be a curved surface that is concave or convex depending on the application. In a specific embodiment, the oblique face region may be a flat surface. Alternatively, the oblique face region may be a curved surface depending upon the application. The oblique face region and the straight face region allow for a maximum transmission of the electromagnetic radiation through the opening region. The waveguide device is preferably made of a highly reflective material at least in the straight face region and the oblique face region. In a specific embodiment, the waveguide device is made of a gold plated alloy. For example, the alloy may be steel and/or other metal materials. The waveguide device is configured to allow for a concentration of the electromagnetic radiation to concentrate at a weld region 516 in the peripheral region in a specific embodiment. A top view of the waveguide device is shown in FIG. 5A. Of cause there can be other variations, modifications, and alternatives.

In a specific embodiment, the waveguide device is provided overlying the aperture region of the concentrator member. In a specific embodiment, a force 522 is applied on the front surface region of the waveguide device to mechanically couple the concentrator member to the back cover member to form the peripheral region as also shown in FIG. 5. In a specific embodiment, the mechanical force can be provided using air pressure or a weight such as a cylinder providing a pressure ranging from about 100 psi to about 200 psi. Other means of mechanical forces, such as an air pressure, may also be used. Of course there can be other variations, modifications, and alternatives.

Referring to FIG. 6, the coupled concentrator member and the back cover member is irradiated using an electromagnetic radiation 602. The electromagnetic radiation may be provided using a energy source such as a laser source or a flash lamp or other suitable energy source. In a specific embodiment, the electromagnetic radiation may be provided using a laser (e.g., laser diode, tunable dye, etc.) having a suitable wavelength range and providing a suitable power range. In a preferred embodiment, the electromagnetic radiation is provided for a time period of about eight seconds or less and preferably 1-4 seconds. Effectively, the electromagnetic radiation traverses through the entire exposed peripheral region of at least the concentrator member of the coupled substrate within the entire time period and provides energy to cause a melt region 608 in the interface region while the inner region is blocked from the electromagnetic radiation.

In a specific embodiment, the electromagnetic radiation and/or laser energy is guided using one or more fiber optics 606 from a source 604 and through the opening region of the waveguide device to the peripheral region of the coupled substrate to provide energy to cause the melt region in the peripheral region. For example, the source 604 is a laser source. The laser source provides pulses of energy and the one or more fiber optics are allowed to translate above the opening region of the waveguide device to provide energy to cause the melt region in the interface region of the coupled substrate members in a specific embodiment. As merely an example, the electromagnetic radiation can be derived from Laser IRAM assembly systems Models 200 and 300 manufactured by Branson Ultrasonics Corp., 41 Eagle Rd., Danbury, Conn. 06813-1961, USA. Of course there can be other variations, modifications, and alternatives.

In a specific embodiment, the light/laser radiation traverses through the entire thickness of the concentrator member, which can be a polymer component transmissive to light. The energy is absorbed at least by the back cover member at the interface region to cause a melt region 608 in the interface region. In a specific embodiment, the back cover member is made of a light absorbing material at least in the second peripheral region. The light absorbing material absorbs irradiation energy traversing at least the first peripheral region of the concentrator element, which is transparent, to cause heating and to form the melting region in the interface region. In a specific embodiment, the light absorbing material can also be a light blocking material or include each of these characteristics. In an alternative embodiment, the light absorbing material may be provided in the interface region to absorb the irradiation energy to cause heating and forming the melt region in the interface region. In a specific embodiment, the concentrator element can be made of an acrylic material characterized by a high transmisivity to light. In a specific embodiment, the back cover member can be a polymer having a high emmisivity. As merely an example, the back cover member can be an acrylic material. Alternatively, the back cover member can be a polycarbonate material. In the example of an acrylic concentrator element and a polycarbonate back cover, the irradiation energy heats the interface region to a temperature of about 110 Degree Celsius to about 115 Degree Celsius to cause the melt region configured to be light absorbing. In a specific embodiment at least 90% of the energy is transmitted through the first peripheral region of the concentrator member and absorbed by the back cover member to cause the melt region as shown by the relationship:

$$E=E_C+E_B.$$

where E is the energy provided by the electromagnetic radiation, $E_C$ is the energy absorbed by the concentrator member in the peripheral region, and $E_B$ is the energy absorbed by the back cover member in the peripheral region.

As shown, $E_B$ ranges from 90% to 95% of E, that is 90% to 95% of the energy is transmitted through the concentrator member and absorbed by the back cover member to cause the melt region in the peripheral region. Of course there can be other variations, modifications, and alternatives.

In a specific embodiment, the melt region forms a seal region 702 for the back cover member and the concentrator member. FIG. 7 is a simplified side-view diagram of a concentrator member and a back cover member according to an embodiment of the present invention. This diagram is merely an example, which should not unduly limit the scope of the claims herein. One of ordinary skill in the art would recognize other variations, modifications, and alternatives. In a specific embodiment, the melt region forms a seal region 702 for the back cover member and the concentrator member. A more detailed diagram of the seal region is also shown. In a specific embodiment, the seal region has a width 704 of about 50 um or less and can include a protruded region 706. In a specific embodiment, the seal region provided is free of contaminations such as particulates or chemical species as may occur by other means. The seal region maintains the photovoltaic strips and electrical conducting element in a desired controlled environment and provides protection from elements such as moisture and others. Of course there can be other variations, modifications, and alternatives.

Figure 8:
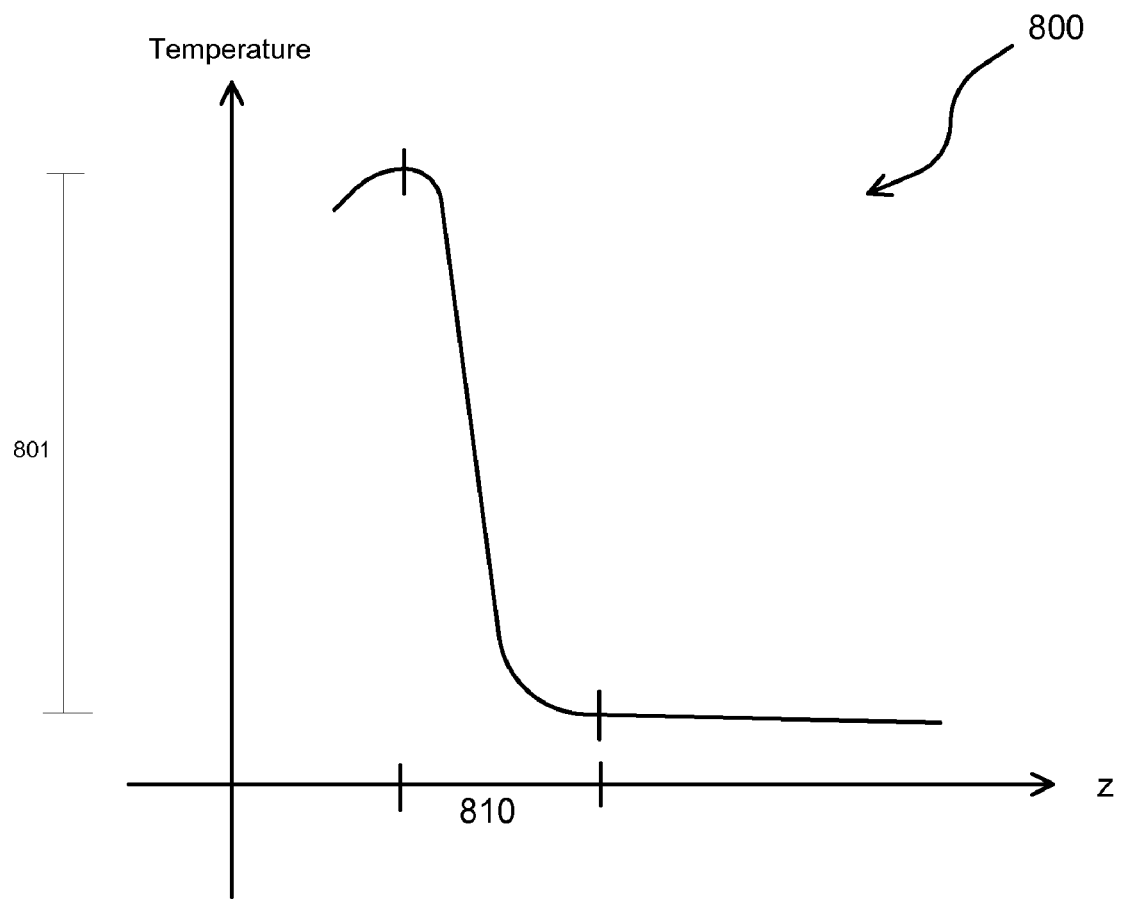
FIG. 8 is a simplified plot of temperature gradient in z direction in the seal region according to an embodiment of the present invention.

Effectively, the irradiation energy causes a temperature gradient within the interface region. Taking acrylic as the material for the concentrator member and polycarbonate as the material for the back cover member as an example. The polycarbonate is designed to be light absorbing and the acrylic is designed to be transmissive. The energy transmitted through the first peripheral region of the concentrator member provides heat energy to increase the temperature of the interface region to about 105 Degree Celsius to about 120 Degree Celsius to cause the melt region. In a specific embodiment, the temperature gradient is provided within a vertical distance in the interface region as illustrated in a simplified plot 800 in FIG. 8. As shown, the temperature is provided on vertical axis and the vertical distance is provided on the horizontal axis. The temperature gradient is essentially provided within a vertical distance 701 as shown. In a specific embodiment, the temperature gradient is provided within a vertical distance of about 40 micron to about 50 micron in the vertical direction. That is the thermal energy is provided within vertical distance 801 for a time period to form the melt region in a specific embodiment. The time period is about eight seconds or less and preferably 4-6 seconds in a specific embodiment. Of course there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating solar cells for a solar panel, the method comprising:

providing a first substrate member comprising a plurality of photovoltaic strips thereon;

providing an optical elastomer material overlying a portion of the first substrate member;

aligning a second substrate member comprising a plurality of optical concentrating elements thereon such that at least one of the optical concentrating elements is operably coupled to at least one of the plurality of photovoltaic strips, wherein the second substrate member comprises an aperture surface region and an exit surface region;

coupling the first substrate member directly to the second substrate member to form an interface region along a first peripheral region of the first substrate member and along a second peripheral region of the second substrate member;

blocking an inner region of the aperture surface region of the second substrate member while exposing the peripheral region of the aperture surface region of the second substrate member; and irradiating an entirety of the second peripheral region of the second substrate member using an electromagnetic radiation to cause a melt region and seal the interface region between the second substrate and the first substrate.

2. The method of claim 1 wherein the coupling further comprises applying a mechanical force to increase pressure at the interface region between the first substrate and the second substrate to maintain the first substrate member and the second substrate member mated together during irradiating.

3. The method of claim 1 wherein the irradiation provides a temperature gradient in a vertical distance of less than 50 μm within the interface region.

4. The method of claim 2 wherein the mechanical force provides a pressure of about 150 psi and greater.

5. The method of claim 1 wherein each of the solar cells is provided in a panel.

6. The method of claim 1 wherein the second substrate member is optically transparent.

7. The method of claim 1 wherein the electromagnetic radiation comprises a flash lamp or a laser source.

8. The method of claim 1 wherein the irradiating is provided for a time period of eight seconds and less.

9. The method of claim 1 further comprising cleaning the interface region before coupling the first substrate member to the second substrate member.

10. The method of claim 1 wherein the interface region has one or more voids of a dimension of 1/1000 of an inch or less before the irradiating.

11. The method of claim 1 wherein the first substrate member comprises a polymer bearing material, a non-conductive material, or a multi-layer material.

12. The method of claim 1 wherein the electromagnetic irradiation traverses through an entirety of the second peripheral region to cause the melt region at the interface region to cause sealing of the interface region between the first substrate member and the second substrate member.

13. A method for fabricating a solar cell free and separate from a solar panel, the method comprising:
   providing a first substrate member comprising a plurality of photovoltaic strips thereon, the first substrate member having a first peripheral region, the first peripheral region including a first flat region and a first structure region, the first structure region including a protruding structure;
   providing an optical elastomer material overlying a portion of the first substrate member;
   providing a second substrate member having a second peripheral region, the second peripheral region including a second flat region and a second structure region, the second structure region including an indent structure;
   aligning the second substrate member comprising a plurality of optical concentrating elements thereon such that the first flat region of the first substrate mates with the second flat region of the second substrate, the second substrate member comprising an aperture surface region and an exit surface region; and
   coupling the first substrate member directly to the second substrate member to form a sealing region between the first peripheral region of the first substrate member and the second peripheral region of the second substrate member and to engage the first structure region of the first substrate to the second structure region of the second substrate.

14. The method of claim 13 wherein the protruding structure is mated to the indent structure using a tongue and groove mechanism.

15. The method of claim 13 wherein the plurality of photovoltaic strips are provided within a respective plurality of recessed regions on the first substrate member.

16. The method of claim 13 wherein the first substrate member comprises a polymer bearing material, a non-conductive material, or a multilayered material.

17. The method of claim 13 wherein each of the photovoltaic strips comprises a silicon bearing material.

18. The method of claim 13 wherein the first substrate member is characterized by a high emissivity at least in the first peripheral region.

19. The method of claim 13 wherein the coupling comprises irradiating an entirety of the second peripheral region of the second substrate member with electromagnetic radiation to cause a melt region and seal the sealing region between the second substrate and the first substrate.

20. The method of claim 19 wherein the electromagnetic radiation comprises a flash lamp or a laser source.

21. The method of claim 19 wherein the electromagnetic radiation is substantially absorbed by the first substrate member in the interface region to cause the melt region.

22. The method of claim 13 wherein the first flat region and the first structure have lengths of about 30 microns to about 100 microns and the second flat region and the second structure have lengths of about 30 microns to about 100 microns.

23. The method of claim 13 wherein the coupling comprises applying a mechanical force to increase pressure at the interface region between the first substrate and the second substrate to maintain the first substrate member and the second substrate member mated together during irradiating.

24. The method of claim 23 wherein the mechanical force provides a pressure of about 150 psi and greater.

25. A method for fabricating a solar cell free and separate from a solar panel, the method comprising:
   providing a first substrate member comprising a plurality of photovoltaic strips configured as an assembly thereon, the first substrate member having a first peripheral region, the first peripheral region including a protruding structure;
   providing an optical elastomer material overlying a portion of the first substrate member;
   providing a second substrate member having a second peripheral region, the second peripheral region including an indent structure;
   aligning the second substrate member comprising a plurality of optical concentrating elements thereon such that the protruding structure of the first substrate mates with the indent structure of the second substrate; and
   coupling the first substrate member directly to the second substrate member to form a sealing region between the first peripheral region of the first substrate member and the second peripheral region of the second substrate member.

* * * * *